(12) United States Patent
Takahashi

(10) Patent No.: US 10,774,212 B2
(45) Date of Patent: Sep. 15, 2020

(54) THERMALLY CONDUCTIVE MATERIAL, RESIN COMPOSITION, AND DEVICE

(71) Applicant: FUJIFILM Corporation, Tokyo (JP)

(72) Inventor: Keita Takahashi, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/045,711

(22) Filed: Jul. 25, 2018

(65) Prior Publication Data

US 2018/0327586 A1 Nov. 15, 2018

Related U.S. Application Data

(63) Continuation of application No. PCT/JP2017/002469, filed on Jan. 25, 2017.

(30) Foreign Application Priority Data

Jan. 26, 2016 (JP) .................................. 2016-012616
Dec. 13, 2016 (JP) .................................. 2016-241362

(51) Int. Cl.

| C08L 63/00 | (2006.01) |
|---|---|
| C08G 59/20 | (2006.01) |
| C08L 101/00 | (2006.01) |
| C09K 5/14 | (2006.01) |
| C08K 3/38 | (2006.01) |
| C08L 33/06 | (2006.01) |
| C08K 3/28 | (2006.01) |
| C08K 9/04 | (2006.01) |
| C08L 33/10 | (2006.01) |
| C08L 33/24 | (2006.01) |
| H05K 7/20 | (2006.01) |
| C08L 33/08 | (2006.01) |

(52) U.S. Cl.
CPC .............. *C08L 63/00* (2013.01); *C08G 59/20* (2013.01); *C08K 3/38* (2013.01); *C08L 101/00* (2013.01); *C09K 5/14* (2013.01); *C08K 9/04* (2013.01); *C08K 2003/282* (2013.01); *C08K 2003/385* (2013.01); *C08K 2003/387* (2013.01); *C08L 33/06* (2013.01); *C08L 33/08* (2013.01); *C08L 33/10* (2013.01); *C08L 33/24* (2013.01); *C08L 2203/206* (2013.01); *H05K 7/2039* (2013.01)

(58) Field of Classification Search
CPC ........ C08L 63/00; C08L 101/00; C08L 33/06; C08L 33/08; C08L 33/10; C08L 33/24; C08L 2203/206; C08G 59/20; C09K 5/14; C08K 3/38; C08K 2003/282; C08K 2003/385; C08K 9/04; C08K 2003/387; H05K 7/2039
USPC ..................................................... 523/400
See application file for complete search history.

(56) References Cited

U.S. PATENT DOCUMENTS

| 4,601,933 A | 7/1986 | Nakamura et al. |
|---|---|---|
| 4,801,394 A | 1/1989 | Nakamura et al. |
| 5,518,783 A | 5/1996 | Kawata et al. |
| 7,109,288 B2 | 9/2006 | Akatsuka et al. |
| 7,696,353 B2 | 4/2010 | Takahashi et al. |
| 7,968,156 B2 | 6/2011 | Tanaka et al. |
| 8,304,554 B2 | 11/2012 | Takahashi et al. |
| 8,524,334 B2 | 9/2013 | Hamasaki et al. |
| 8,981,108 B2 | 3/2015 | Hamasaki et al. |
| 9,481,658 B2 | 11/2016 | Hamasaki et al. |
| 9,629,239 B2 | 4/2017 | Ohtsuka et al. |
| 2006/0078754 A1* | 4/2006 | Murakami ........... C08K 5/3475 428/532 |
| 2006/0216440 A1* | 9/2006 | Nishikawa ............. C09K 19/18 428/1.33 |
| 2006/0276568 A1 | 12/2006 | Akatsuka et al. |
| 2008/0311300 A1 | 12/2008 | Burdinski et al. |
| 2015/0069288 A1* | 3/2015 | Hong ...................... C09K 5/14 252/71 |
| 2016/0154278 A1* | 6/2016 | Kang ..................... C09K 19/52 349/123 |

FOREIGN PATENT DOCUMENTS

| CN | 101292182 | 10/2008 |
|---|---|---|
| CN | 103429633 | 12/2013 |
| JP | S6086192 | 5/1985 |
| JP | H07281028 | 10/1995 |

(Continued)

OTHER PUBLICATIONS

Yoshida et al., JP 2013-227451 A machine translation in English, Nov. 7, 2013 (Year: 2013).*
C. Destrade, et al., "Disc-Like Mesogens: A Classification," Molecular Crystals and Liquid Crystals, vol. 71, Issue1-2, Aug. 1981, pp. 111-135.
The Chemical Society of Japan, "Chemistry of Liquid Crystal," Quarterly Review of Chemistry, No. 22, 25 Apr. 1994, pp. 1-24.
Bernd Kohne, et al., "Hexa-O-alkanoyl-scyllo-inositols, the First Alicyclic, Saturated, Discotic Liquid Crystals," Angew, Chem. Int. Ed., 23, Jan. 1984, pp. 82-83.
Jinshan Zhang, et al., "Liquid Crystals Based on Shape-Persistent Macrocyclic Mesogens," J. Am. Chem. Soc., Mar. 1994, pp. 2655-2656.

(Continued)

*Primary Examiner* — David T Karst
(74) *Attorney, Agent, or Firm* — JCIPRNET

(57) ABSTRACT

The present invention provides a thermally conductive material containing a disk-like compound as a thermally conductive material having high thermal conductivity and high heat resistance. For example, the present invention provides a thermally conductive material containing a cured substance of a resin composition containing a disk-like compound having two or more functional groups, in which the functional groups are selected from the group consisting of a (meth)acryl group, a (meth)acrylamide group, an oxiranyl group, an oxetanyl group, a hydroxyl group, an amino group, a thiol group, an isocyanate group, a carboxyl group, and a carboxylic acid anhydride group. The present invention also provides a device, which includes the aforementioned thermally conductive material, and the aforementioned resin composition.

18 Claims, No Drawings

(56) References Cited

FOREIGN PATENT DOCUMENTS

| | | |
|---|---|---|
| JP | H07306317 | 11/1995 |
| JP | 2696480 | 1/1998 |
| JP | H10307208 | 11/1998 |
| JP | H11323162 | 11/1999 |
| JP | 2000119652 | 4/2000 |
| JP | 2001192500 | 7/2001 |
| JP | 2003073672 | 3/2003 |
| JP | 2005156822 | 6/2005 |
| JP | 2006076992 | 3/2006 |
| JP | 2006301614 | 11/2006 |
| JP | 2007002220 | 1/2007 |
| JP | 2008013759 | 1/2008 |
| JP | 4118691 | 7/2008 |
| JP | 2009502529 | 1/2009 |
| JP | 2010125782 | 6/2010 |
| JP | 2010244038 | 10/2010 |
| JP | 4592225 | 12/2010 |
| JP | 4694929 | 6/2011 |
| JP | 2012067225 | 4/2012 |
| JP | 2013227451 | 11/2013 |
| JP | 5385937 | 1/2014 |
| JP | 5620129 | 11/2014 |
| JP | 2015052710 | 3/2015 |
| WO | 2014181930 | 11/2014 |

OTHER PUBLICATIONS

Terutsune Osawa et al.,"Wide-Range 2D Lattice Correlation Unveiled for Columnarly Assembled Triphenylene Hexacarboxylic Esters", Angewandte Communications,vol. 51, Issue32, Aug. 6, 2012,pp. 7990-7993.
Maruzen Co., Ltd.,"Liquid Crystal Handbook",the manual of Liquid Crystal Handbook,with brief English explanation, publish on Oct. 30, 2000, pp. 330-333.
Yoshinobu Nakamura, "Effect of silane coupling agent and hot to use it," Science & Technology Co., Ltd.,with brief English explanation, Nov. 15, 2012, pp. 1-2.
Yoshitaka Takezawa, "Highly Thermally Conductive Composite Material",CMC Publishing Co.,LTD.,with brief English explanation, Jan. 26, 2011, pp. 63-78.
Hideyuki Nishikawa, et al., "Studies of Discotic Liquid Crystalline with Polymerizable Groups, Triphenylene Derivatives," The Journal of the Society of Synthetic Organic Chemistry, Dec. 2002, pp. 1-14.
D. J. Broer, et al., "In-situ photopolymerization of oriented liquid-crystalline acrylates, 5.*. Influence of the alkylene spacer on the properties of the mesogenic monomers and the formation and properties of oriented polymer networks," Macromolecular Chemistry and Physics, vol. 192, No. 1, Jan. 1991, pp. 1-20.
Masaki Okazaki, et al., "Polymerizable discoticnematic triphenylene derivatives and their application to an optically anisotropic film," Polymer of Advanced Technologies, Nov. 2000, pp. 398-403.
Dong-Gue Kang, et al., "Heat Transfer Organic Materials: Robust Polymer Films with the Outstanding Thermal Conductivity Fabricated by the Photopolymerization of Uniaxially Oriented Reactive Discogens," ACS Appl. Mater. Interfaces, Aug. 2016, pp. 30492-30501.
"International Search Report (Form PCT/ISA/210) of PCT/JP2017/002469," dated May 9, 2017, with English translation thereof, pp. 1-5.
"International Preliminary Report on Patentability (Form PCT/IPEA/409) of PCT/JP2017/002469," completed on Mar. 28, 2018, with English translation thereof, pp. 1-22.
"Office Action of Japan Counterpart Application," dated Sep. 10, 2019, p. 1-p. 4.
"Office Action of China Counterpart Application," with English translation thereof, dated Jan. 13, 2020, p. 1-p. 33.
"Office Action of Korea Counterpart Application," with English translation thereof, dated Jan. 17, 2020, p. 1-p. 12.
Zhou Wenying et al., "Thermally Conductive Polymer Materials", National Defence Industry Press, Apr. 30, 2014, pp. 1-2 and 321-323.
Kang, D.-G., "Fabrication of Disc-shaped Mesogenic Liquid Crystal Networks for the Heat Dissipation Materials", M. E. Thesis, Chonbuk National University, Dec. 31, 2015, pp. 1-3, 20-21, 31-33, 36, 56-60 and 62.
American Chemical Society, "RN: 174782-69-5", STN International, Apr. 4, 1996, Available at: "https://www.stn.org".
American Chemical Society, "RN: 200814-81-9", STN International, Feb. 5, 1998, Available at: https://www.stn.org.
American Chemical Society, "RN: 4877-80-9", STN International, Nov. 16, 1984, Available at: "https://www.stn.org".
American Chemical Society, "RN: 163797-44-2", STN International, Jun. 16, 1995, Available at: "https://www.stn.org".
Dong-Gue Kang et al., "Heat Transfer Organic Materials: Robust Polymer Films with the Outstanding Thermal Conductivity Fabricated by the Photopolymerization of Uniaxially Oriented Reactive Discogens", ACS Applied Materials & Interfaces, vol. 8, No. 44, Oct. 20, 2016, pp. 30492-30501.
"Office Action of Korea Counterpart Application", dated Apr. 24, 2020, with English translation thereof, pp. 1-6.

* cited by examiner

THERMALLY CONDUCTIVE MATERIAL, RESIN COMPOSITION, AND DEVICE

CROSS-REFERENCE TO RELATED APPLICATIONS

This application is a continuation of PCT International Application No. PCT/JP2017/002469 filed on Jan. 25, 2017, which claims priority under 35 U.S.C. § 119 (a) to Japanese Patent Applications Nos. 2016-012616 and 2016-241362 filed on Jan. 26, 2016 and Dec. 13, 2016, respectively, the entire contents of which are incorporated herein by reference.

BACKGROUND OF THE INVENTION

1. Field of the Invention

The present invention relates to a thermally conductive material. Furthermore, the present invention relates to a resin composition used for manufacturing the thermally conductive material and a device including the thermally conductive material.

2. Description of the Related Art

In recent years, power semiconductor devices used in various electric instruments such as personal computers, general home appliances, and automobiles have rapidly become compact. The control of heat generated from the power semiconductor devices, which have been highly densified along with the compactification, is one of the issues raised as the power semiconductor devices have been put to practical use. As thermally conductive materials for heat dissipation, a number of resin materials that have excellent workability and can be easily laminated have been developed. According to recent reports, there are cases where a liquid crystal compound is used as a resin material (JP1999-323162A (JP-H11-323162A) and JP4118691B).

SUMMARY OF THE INVENTION

The power semiconductor devices used by being mounted on various electric instruments such as automobiles are assumed to be used at a high temperature, and accordingly, higher heat resistance is required for the devices. The thermally conductive materials of the related art such as the thermally conductive materials described in JP1999-323162A (JP-H11-323162A) and JP4118691B have not been examined enough regarding the heat resistance. Furthermore, the thermally conductive materials described in JP1999-323162A (JP-H11-323162A) and JP4118691B need to be further ameliorated in terms of thermal conductivity.

In addition, because the thermally conductive materials described in JP1999-323162A (JP-H11-323162A) and JP4118691B are cured substances, they cannot be used at sites hard to be treated by light irradiation or heating.

An object of the present invention is to provide a thermally conductive material having high thermal conductivity and high heat resistance. Another object of the present invention is to provide a resin composition which can be used for manufacturing the thermally conductive material and a device including the thermally conductive material. Another object of the present invention is to provide a thermally conductive material having a wide range of applications.

In order to achieve the aforementioned objects, the inventor of the present invention conducted intensive examinations. As a result, the inventor obtained knowledge that in a case where a compound having a so-called disk-like structure is used, it is possible to provide a thermally conductive material having high thermal conductivity and high heat resistance. Furthermore, the inventor obtained knowledge that even though a composition containing a compound having a disk-like structure is uncured, the composition has thermal conductivity. Based on the knowledge, the inventor has accomplished the present invention.

That is, the present invention provides [1] to [22] described below.

[1] A thermally conductive material comprising a disk-like compound.

[2] The thermally conductive material described in [1], in which the disk-like compound is either a compound obtained by a reaction of one or more compounds selected from the group consisting of compounds represented by any of General Formulae D1 to D16 at Q or one or more compounds selected from the group consisting of compounds represented by any of General Formulae D1 to D16.

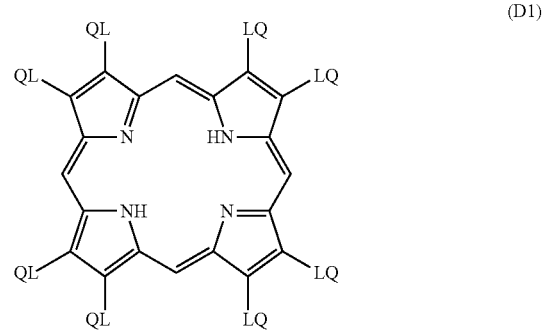

(D1)

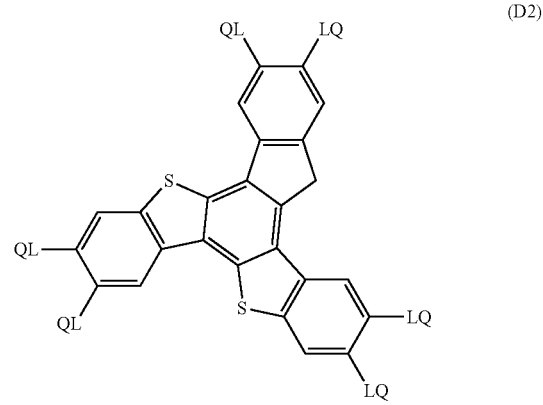

(D2)

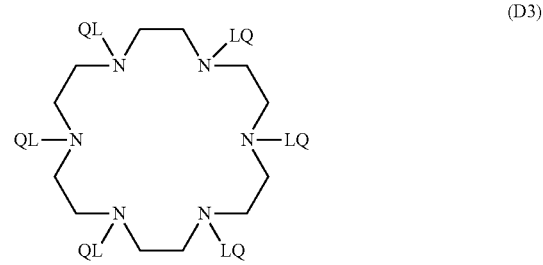

(D3)

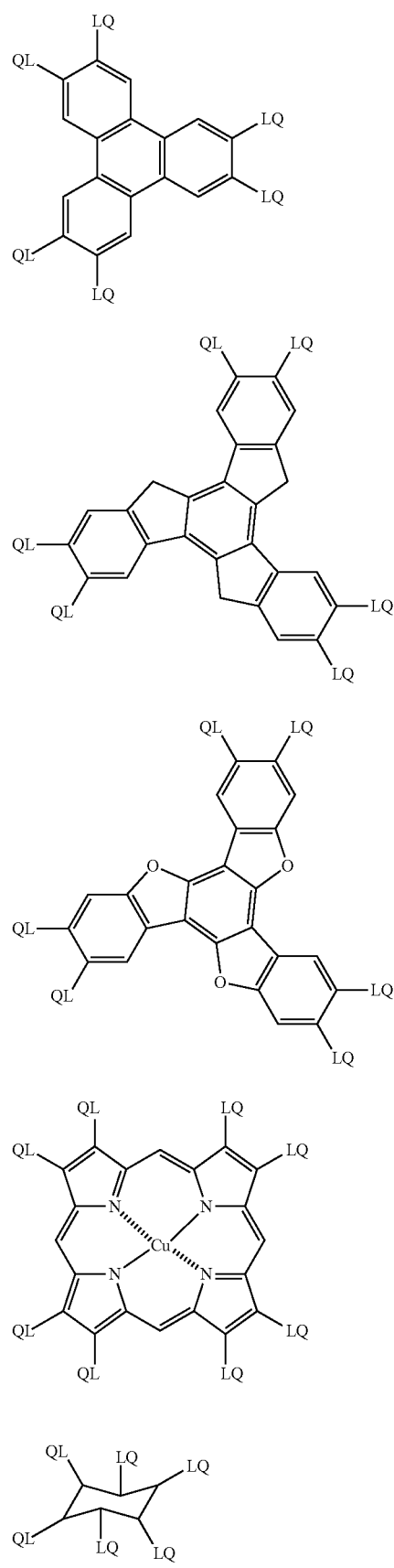

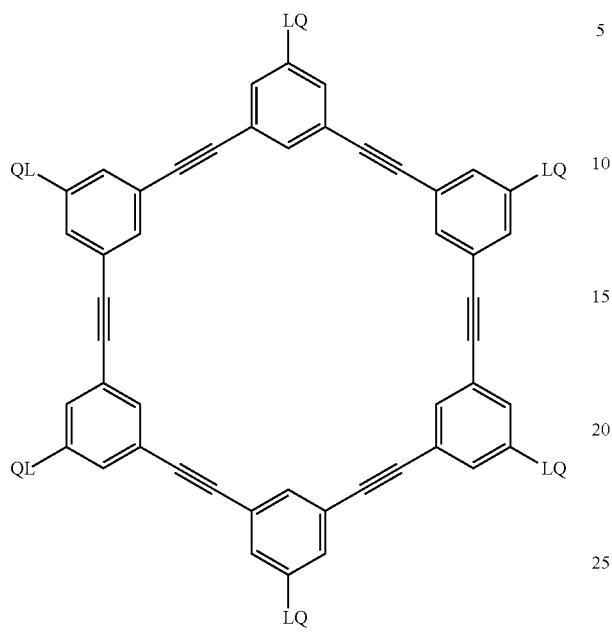
(D12)

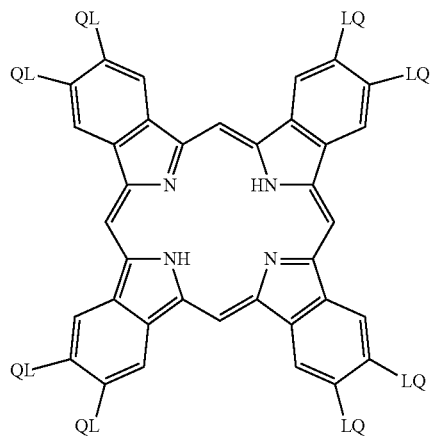
(D13)

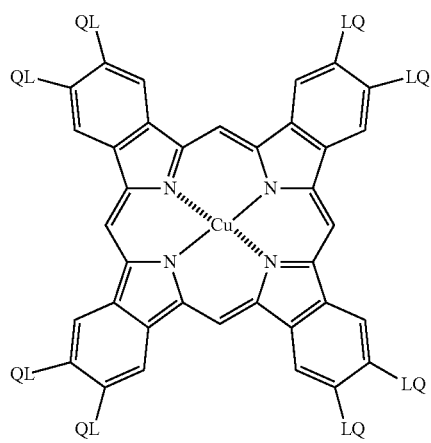
(D14)

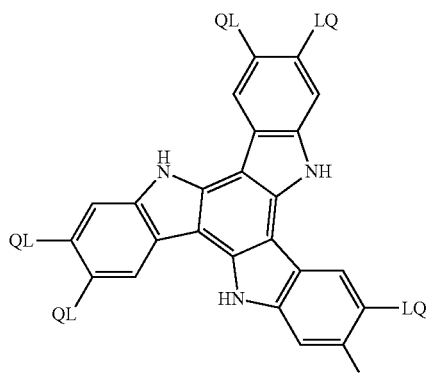
(D15)

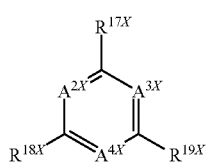
(D16)

In D1 to D16, L represents a divalent linking group;
Q represents a hydrogen atom, a halogen atom, a cyano group, or a functional group,
$A^{2x}$, $A^{3x}$, and $A^{4x}$ each independently represent —CH= or N=, $R^{17x}$, $R^{18x}$, and $R^{19x}$ each independently represent *—$X^{211x}$—($Z^{21x}$—$X^{212x}$)$_{n21x}$-Q, * represents a position bonded to a central ring, $X^{211X}$ and $X^{212X}$ each independently represent a single bond, —O—, —C(=O)—, —OC(=O)—, —OC(=O)O—, —OC(=O)NH—, —OC(=O)S—, —C(=O)O—, —C(=O)NH—, —C(=O)S—, —NHC(=O)—, —NHC(=O)O—, —NHC(=O)NH—, —NHC(=O)S—, —S—, —SC(=O)—, —SC(=O)O—, —SC(=O)NH—, or —SC(=O)S—, $Z^{21X}$ each independently represents an aromatic group as a 5-membered or 6-membered ring or a non-aromatic group as a 5-membered or 6-membered ring, $L^{21X}$ represents a divalent linking group or a single bond linking $X^{212X}$ and $P^{21X}$ to each other, $n^{21X}$ represents an integer of 0 to 3, and in a case where $n^{21X}$ is equal to or greater than 2, a plurality of groups represented by $Z^{21X}$—$X^{212X}$ may be the same as or different from each other.

[3] The thermally conductive material described in [2], comprising a cured substance of a resin composition containing the disk-like compound, in which the disk-like compound has one or more functional groups.

[4] The thermally conductive material described in [1], comprising a cured substance of a resin composition containing a disk-like compound having two or more functional groups, in which the functional groups are selected from the group consisting of a (meth)acryl group, a (meth)acrylamide group, an oxiranyl group, an oxetanyl group, a hydroxyl group, an amino group, a thiol group, an isocyanate group, a carboxyl group, and a carboxylic acid anhydride group.

[5] The thermally conductive material described in [4], in which the disk-like compound has 3 to 8 functional groups described above.

[6] The thermally conductive material described in [4] or [5], in which the disk-like compound is a compound represented by General Formula (XI).

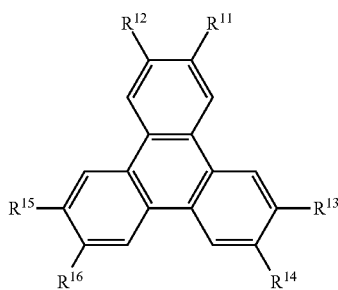

General Formula XI

In the formula, $R^{11}$, $R^{12}$, $R^{13}$, $R^{14}$, $R^{15}$, and $R^{16}$ each independently represent *—$X^{11}$-$L^{11}$-$P^{11}$ or *—$X^{12}$—$Y^{12}$, * represents a position bonded to a triphenylene ring, two or more among $R^{11}$, $R^{12}$, $R^{13}$, $R^{14}$, $R^{15}$, and $R^{16}$ represent *—$X^{11}$-$L^{11}$-$P^{11}$, $X^{11}$ and $X^{12}$ each independently represent a single bond, —O—, —C(=O)—, —OC(=O)—, —OC(=O)O—, —OC(=O)NH—, —OC(=O)S—, —C(=O)O—, —C(=O)NH—, —C(=O)S—, —NHC(=O)—, —NHC(=O)O—, —NHC(=O)NH—, —NHC(=O)S—, —S—, —SC(=O)—, —SC(=O)O—, —SC(=O)NH—, or —SC(=O)S—, $L^{11}$ represents a divalent linking group or a single bond, $P^{11}$ represents a functional group selected from the group consisting of a (meth)acryl group, a (meth)acrylamide group, an oxiranyl group, an oxetanyl group, a hydroxyl group, an amino group, a thiol group, an isocyanate group, a carboxyl group, and a carboxylic acid anhydride group, and $Y^{12}$ represents a hydrogen atom, a linear, branched, or cyclic alkyl group having 1 to 20 carbon atoms, or a group obtained in a case where one methylene group or two or more methylene groups in a linear, branched, or cyclic alkyl group having 1 to 20 carbon atoms are substituted with —O—, —S—, —NH—, —N(CH$_3$)—, —C(=O)—, —OC(=O)—, or —C(=O)O—.

[7] The thermally conductive material described in [6], in which $R^{11}$, $R^{12}$, $R^{13}$, $R^{14}$, $R^{15}$, and $R^{16}$ are the same as each other.

[8] The thermally conductive material described in [4] or [5], in which the disk-like compound is a compound represented by General Formula (XII).

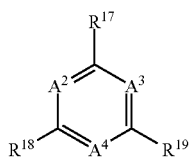

General Formula (XII)

In the formula, $A^2$, $A^3$, and $A^4$ each independently represent —CH= or N=, $R^{17}$, $R^{18}$, and $R^{19}$ each independently represent *—$X^{211}$—($Z^{21}$—$X^{212}$)$_{n21}$-$L^{21}$-$P^{21}$ or *—$X^{211}$—($Z^{22}$—$X^{222}$)$_{n22}$—$Y^{22}$, * represents a position bonded to a central ring, two or more among $R^{17}$, $R^{18}$, and $R^{19}$ represent *—$X^{211}$—($Z^{21}$—$X^{212}$)$_{n21}$-$L^{21}$-$P^{21}$, $X^{211}$ and $X^{212}$ each independently represent a single bond, —O—, —C(=O)—, —OC(=O)—, —OC(=O)O—, —OC(=O)NH—, —OC(=O)S—, —C(=O)O—, —C(=O)NH—, —C(=O)S—, —NHC(=O)—, —NHC(=O)O—, —NHC(=O)NH—, —NHC(=O)S—, —S—, —SC(=O)—, —SC(=O)O—, —SC(=O)NH—, or —SC(=O)S—, $Z^{21}$ and $Z^{22}$ each independently represent an aromatic group as a 5-membered or 6-membered ring or a non-aromatic group as a 5-membered or 6-membered ring, $L^{21}$ represents a divalent linking group or a single bond linking $X^{212}$ and $P^{21}$ each other, $P^{21}$ represents a functional group selected from the group consisting of a (meth)acryl group, a (meth)acrylamide group, an oxiranyl group, an oxetanyl group, a hydroxyl group, an amino group, a thiol group, an isocyanate group, a carboxyl group, and a carboxylic acid anhydride group, $Y^{22}$ represents a hydrogen atom, a linear, branched, or cyclic alkyl group having 1 to 20 carbon atoms, or a group obtained in a case where one methylene group or two or more methylene groups in a linear, branched, or cyclic alkyl group having 1 to 20 carbon atoms are substituted with —O—, —S—, —NH—, —N(CH$_3$)—, —C(=O)—, —OC(=O)—, or —C(=O)O—, $n^{21}$ and $n^{22}$ each independently represent an integer of 0 to 3, and in a case where each of $n^{21}$ and $n^{22}$ is equal to or greater than 2, a plurality of groups represented by $Z^{21}$—$X^{212}$ and $Z^{22}$—$X^{222}$ may be the same as or different from each other.

[9] The thermally conductive material described in [8], in which $R^{17}$, $R^{18}$, and $R^{19}$ are the same as each other.

[10] The thermally conductive material described in any one of [3] to [9], in which the resin composition contains a curing agent having a group selected from the group consisting of an amino group, a thiol group, a hydroxyl group, a carboxyl group, a carboxylic acid anhydride group, and an isocyanate group.

[11] The thermally conductive material described in [10], in which the resin composition contains the disk-like compound having an oxiranyl group.

[12] The thermally conductive material described in any one of [3] to [11], in which a content of an inorganic substance in the resin composition with respect to the mass of solid contents in the resin composition is 30% by mass to 90% by mass.

[13] The thermally conductive material described in [2], in which the disk-like compound includes one or more compounds which are selected from the group consisting of compounds represented by any of General Formulae D1 to D16, and in which all Q's represent a hydrogen atom, a halogen atom, or a cyano group.

[14] The thermally conductive material described in any one of [1] to [13], in which the disk-like compound is a liquid crystal compound.

[15] The thermally conductive material described in any one of [1] to [14], further comprising an inorganic substance.

[16] The thermally conductive material described in [15], in which the inorganic substance is an inorganic nitride or an inorganic oxide.

[17] The thermally conductive material described in [16], in which the inorganic substance is boron nitride or aluminum nitride.

[18] The thermally conductive material described in [16] or [17], in which a surface of the inorganic substance is modified with a boronic acid compound or an aldehyde compound.

[19] The thermally conductive material described in any one of [1] to [18], in which the thermally conductive material is in the form of a sheet and comprises a layer formed of a composition containing the disk-like compound.

[20] The thermally conductive material described in [19] that is a heat dissipation sheet.

[21] The resin composition used for manufacturing the thermally conductive material described in any one of [3] to [12].

[22] A device comprising the thermally conductive material described in any one of [1] to [20].

According to the present invention, a thermally conductive material having high thermal conductivity and high heat resistance is provided. Furthermore, the present invention provides a resin composition which can be used for manufacturing the thermally conductive material. By using the thermally conductive material of the present invention, a device having high durability can be provided.

Furthermore, according to the present invention, it is possible to provide a thermally conductive material which does not have a specific shape and has a wide range of applications.

DESCRIPTION OF THE PREFERRED EMBODIMENTS

Hereinafter, the present invention will be specifically described.

In the present specification, "to" means that the numerical values listed before and after "to" are of a lower limit and an upper limit, respectively. In the present specification, the description of "(meth)acryl group" means "either or both of an acryl group and a methacryl group". The same is true for the description of "(meth) acrylate", "(meth)acrylamide group", or the like.

<<Thermally Conductive Material>>

The thermally conductive material of the present invention is a material having thermal conductivity. Generally, the thermally conductive material can be used as a heat dissipation material and as a material for dissipating heat generated from various devices such as power semiconductor devices. The shape of the thermally conductive material is not particularly limited, and the thermally conductive material may be molded to have various shapes according to the use. Typically, it is preferable that the thermally conductive material is in the form of a sheet after molding. In the present specification, "the form of a sheet" means the form of a film or plate. Furthermore, it is preferable that the thermal conductivity of the thermally conductive material of the present invention is not anisotropic but isotropic.

The thermally conductive material of the present invention may be a fluid that has no shape. Particularly, in a second aspect of the present invention in which an uncured substance of a composition containing a disk-like compound is used, the thermally conductive material may be a fluid. It is preferable that the fluid is viscous.

the thermally conductive material of the present invention contains a disk-like compound. The thermally conductive material may be formed of a composition containing a disk-like compound or includes a member formed of a composition containing a disk-like compound. Particularly, in a case where the thermally conductive material is in the form of a sheet, it is preferable that the thermally conductive material includes a layer formed of a composition containing a disk-like compound. In the present specification, by definition, "composition containing a disk-like compound" includes not only a composition containing a disk-like compound and other components but also a disk-like compound (composition composed solely of a disk-like compound).

In the present specification, "formed of a composition containing a disk-like compound" means "composed of a composition containing a disk-like compound" and "formed by curing a composition containing a disk-like compound".

In the present specification, a composition for forming a cured substance particularly refers to a resin composition.

That is, in the present specification, by definition, in a case where a composition containing a disk-like compound is mentioned, the composition includes a resin composition containing a disk-like compound.

The composition containing a disk-like compound may contain one kind of disk-like compound or two or more kinds of disk-like compounds.

The composition containing a disk-like compound may contain, in addition to the disk-like compound, an inorganic substance, a surface modifier for the inorganic substance, and the like. Particularly, the resin composition may further contain a curing accelerator, a polymerization initiator, and a curing agent or a main agent other than the disk-like compound. In the present specification, a curing agent means a compound having a functional group selected from a hydroxyl group, an amino group, a thiol group, an isocyanate group, a thioisocyanate group, an aldehyde group, a carboxyl group, a carboxylic acid anhydride group, and a sulfo group. A main agent means a compound having a functional group selected from the group consisting of an unsaturated polymerizable group (a (meth)acryl group, a (meth)acrylamide group, or the like), an oxiranyl group, an oxetanyl group, and an aziridinyl group. The resin composition may contain only a main agent or a main agent and a curing agent.

<Disk-Like Compound>

The disk-like compound means a compound having a disk-like structure in at least a portion thereof. By the disk-like structure, the disk-like compound can have a columnar structure by forming a stacking structure. As the disk-like compound, a compound is preferable which has at least an aromatic ring and can form a columnar structure by the formation of a stacking structure based on the intermolecular π-π interaction.

The inventor has found that the compound having a disk-like structure brings about higher thermal conductivity compared to the liquid crystal compound described in JP1999-323162A (JP-H11-323162A) or JP4118691B. Regarding such high thermal conductivity, the inventor does not stick to a specific theory but considers that while the rod-like compound described in JP1999-323162A (JP-H11-323162A) or JP4118691B can only linearly (one-dimensionally) conduct heat, the disk-like compound can flatwise (two-dimensionally) conduct heat in the direction of a line normal to the disk-like structure of the compound, and accordingly, the number of heat conduction paths increase, and the thermal conductivity is improved. Furthermore, in the present invention, an alignment treatment or the like is not particularly performed on a resin. Therefore, the thermal conductivity of the thermally conductive material of the present invention is not anisotropic but isotropic.

The disk-like compound may be a liquid crystal compound or a non-liquid crystal compound, but is preferably a liquid crystal compound.

Specific examples of the disk-like compound include a compound represented by any of General Formulae D1 to D16 shown below or a compound obtained in a case where a compound represented by any of General Formulae D1 to D16 shown below performs a reaction at Q.

The disk-like compound may be any other compounds having the structural unit (disk-like core structure) of a compound represented by any of General Formulae D1 to D15 except for the substituent of LQ or may be any other compounds having the structural unit of a compound represented by General Formula D16 except for the substituent of $L^{21x}$-Q.

In a case where the disk-like compound is a compound obtained in a case where a compound represented by any of General Formulae D1 to D16 shown below performs a reaction at Q, Q is preferably a functional group. The reaction may be a reaction appropriate for the functional group represented by Q, and for example, it may be a reaction generally known as a polymerization reaction or a cross-linking reaction.

In a case where the disk-like compound is a compound obtained in a case where a compound represented by any of General Formulae D1 to D16 performs a reaction at Q, examples thereof include a polymer of the aforementioned compound. The polymer may be a monopolymer which is formed only of one kind of compound represented by any of General Formulae D1 to D16, a copolymer containing two or more kinds of compounds represented by General Formulae D1 to D16, or a copolymer (for example, the curing agent or the main agent which will be described later) which includes one or more kinds of compounds represented by any of General Formulae D1 to D16 and other comonomer. The polymer may have a cross-linked structure.

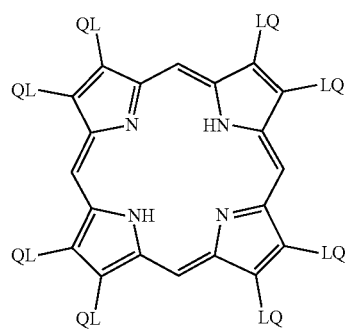
(D1)

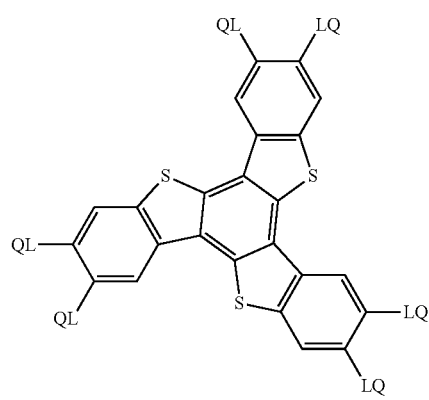
(D2)

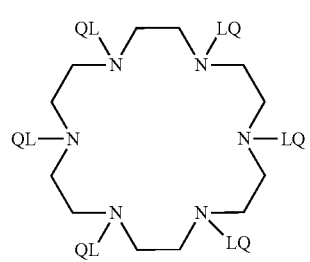
(D3)

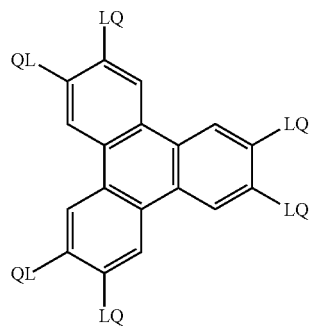
(D4)

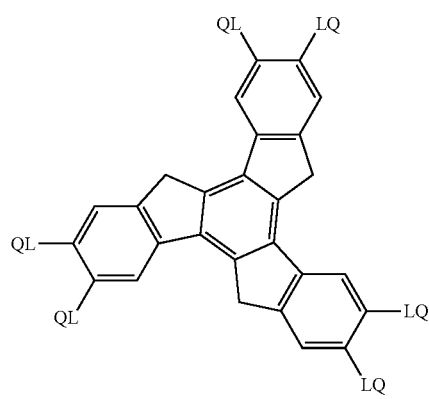
(D5)

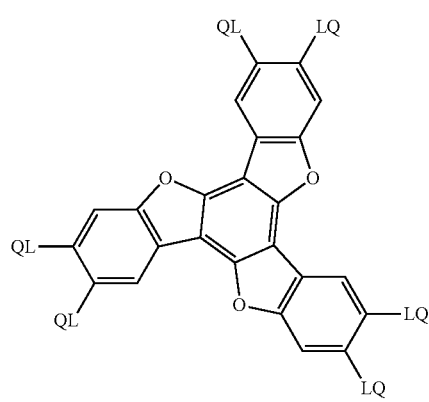
(D6)

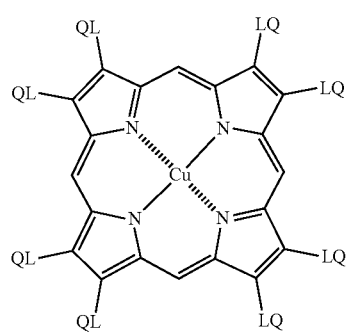
(D7)

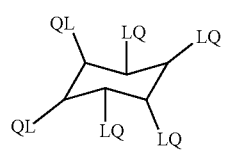
(D8)

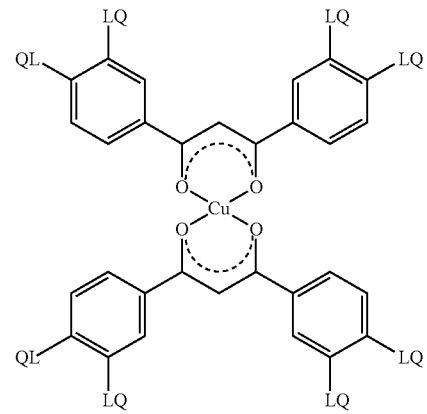
(D9)
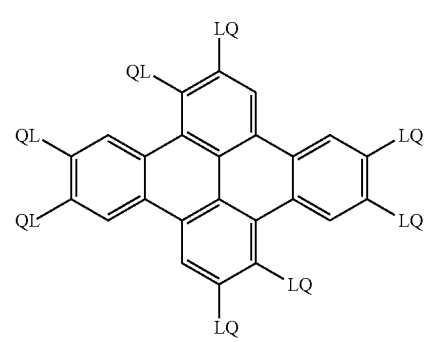
(D10)
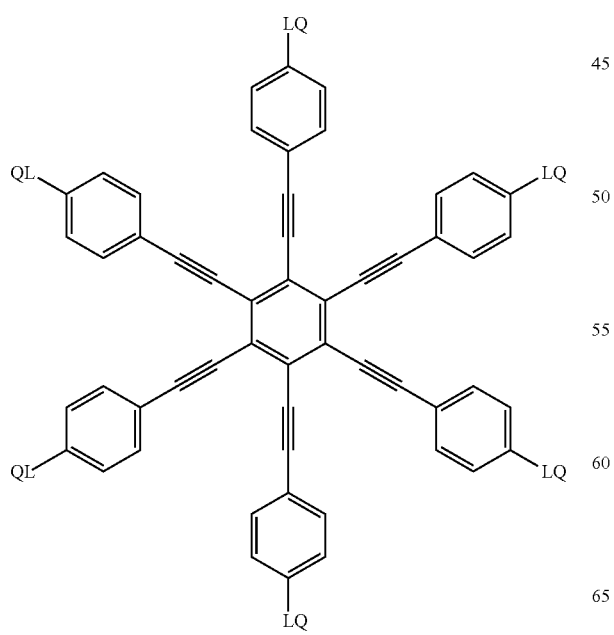
(D11)
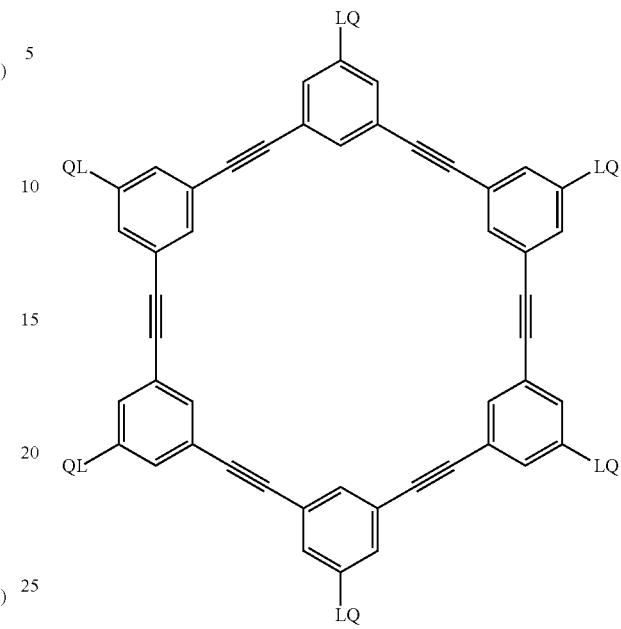
(D12)
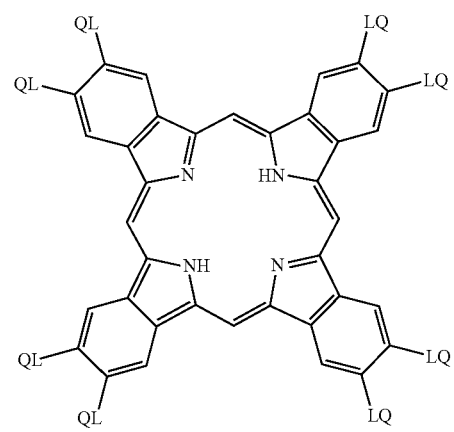
(D13)
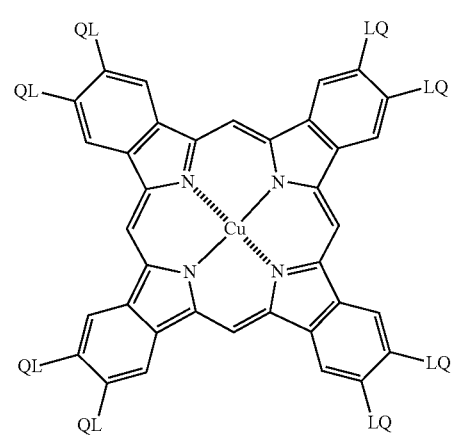
(D14)

-continued

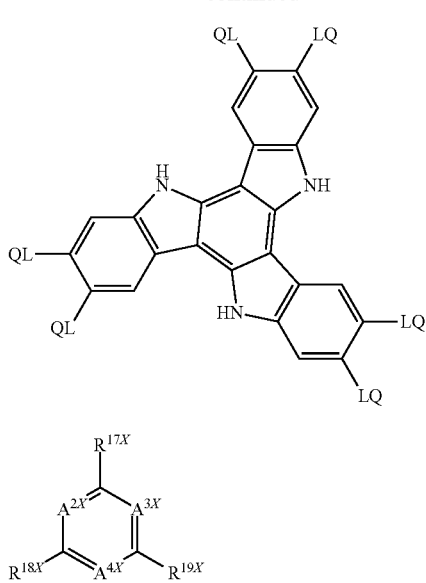
(D15)

(D16)

In D1 to D16, L represents a divalent linking group;
Q represents a hydrogen atom, a halogen atom, a cyano group, or a functional group,
$A^{2x}$, $A^{3x}$, and $A^{4x}$ each independently represent —CH= or N=, $R^{17x}$, $R^{18x}$, and $R^{19x}$, each independently represent *—$Y^{211x}$—$(Z^{21x}$—$X^{212x})_{n21x}$-$L^{21x}$-Q, * represents a position bonded to a central ring, $X^{211X}$ and $X^{212X}$ each independently represent a single bond, —O—, —C(=O)—, —OC(=O)—, —OC(=O)O—, —OC(=O)NH—, —OC(=O)S—, —C(=O)O—, C(=O)NH—, —C(=O)S—, —NHC(=O)—, —NHC(=O)O—, —NHC(=O)NH—, —NHC(=O)S—, —S—, —SC(=O)—, —SC(=O)O—, —SC(=O)NH—, or —SC(=O)S—, $Z^{21X}$ each independently represents an aromatic group as a 5-membered or 6-membered ring or a non-aromatic group as a 5-membered or 6-membered ring, $L^{21x}$ represents a divalent linking group or a single bond linking $X^{212X}$ and Q to each other, $n^{21X}$ represents an integer of 0 to 3, and in a case where $n^{21X}$ is equal to or greater than 2, a plurality of groups represented by $Z^{21X}$—$X^{212X}$ may be the same as or different from each other.

The divalent linking group (L) in D1 to D15 is preferably a divalent linking group selected from the group consisting of an alkylene group, an alkenylene group, an arylene group, —CO—, —NH—, —O—, —S—, and a combination of these. The divalent linking group (L) is more preferably a group obtained by combining at least two divalent groups selected from the group consisting of an alkylene group, an alkenylene group, an arylene group, —CO—, —NH—, —O—, and —S—. The divalent linking group (L) is most preferably a group obtained by combining at least two divalent groups selected from the group consisting of an alkylene group, an alkenylene group, an arylene group, —CO—, and —O—. The number of carbon atoms in the alkylene group is preferably 1 to 12. The number of carbon atoms in the alkenylene group is preferably 2 to 12. The number of carbon atoms in the arylene group is preferably 6 to 10. The alkylene group, the alkenylene group, and the arylene group may have a substituent (for example, an alkyl group, a halogen atom, cyano, an alkoxy group, or an acyloxy group).

Examples of the divalent linking group (L) will be shown below. The left side is bonded to a disk-like core (D), and the right side is bonded to Q. AL means an alkylene group or an alkenylene group, and AR means an arylene group.
L101: -AL-CO—O-AL-
L102: -AL-CO—O-AL-O—
L103: -AL-CO—O-AL-O-AL-
L104: -AL-CO—O-AL-O—CO—
L105: —CO-AR-O-AL-
L106: —CO-AR-O-AL-O—
L107: —CO-AR-O-AL-O—CO—
L108: —CO—NH-AL-
L109: —NH-AL-O—
L110: —NH-AL-O—CO—
L111: —O-AL-
L112: —O-AL-O—
L113: —O-AL-O—CO—
L114: —O-AL-O—CO—NH-AL-
L115: —O-AL-S-AL-
L116: —O—CO-AL-AR-O-AL-O—CO—
L117: —O—CO-AR-O-AL-CO—
L118: —O—CO-AR-O-AL-O—CO—
L119: —O—CO-AR-O-AL-O-AL-O—CO—
L120: —O—CO-AR-O-AL-O-AL-O-AL-O—CO—
L121: —S-AL-
L122: —S-AL-O—
L123: —S-AL-O—CO—
L124: —S-AL-S-AL-
L125: —S-AR-AL-
L126: —O—CO-AL
L127: —O—CO-AL-O
L128: —O—CO-AR-O-AL Q represents a hydrogen atom, a halogen atom, a cyano group, or a functional group. Examples of the functional group include an unsaturated polymerizable group, an oxiranyl group, an oxetanyl group, an aziridinyl group, a hydroxyl group, an amino group, a thiol group, an isocyanate group, a thioisocyanate group, an aldehyde group, a carboxyl group, a carboxylic acid anhydride group, and a sulfo group. Examples of the unsaturated polymerizable group include a (meth)acryl group, a (meth)acrylamide group, and substituents represented by Q1 to Q7 shown below.

—CH=CH₂ (Q1)

—CH=CH—CH₃ (Q2)

—CH=CH—C₂H₅ (Q3)

—CH=CH—n-C₃H₇ (Q4)

—C(CH₃)=CH₂ (Q5)

—CH=C(CH₃)—CH₃ (Q6)

—C≡CH (Q7)

In the present specification, an oxiranyl group is a functional group referred to as an epoxy group as well. The oxiranyl group may be a group including oxacyclopropane (oxirane), and also includes a group, in which two adjacent carbon atoms in a saturated hydrocarbon ring group form an oxirane ring by being bonded to each other through an oxo group (—O—), and the like, for example.

In the present specification, in a case where "hydroxyl group" is exemplified as a functional group, the hydroxyl group is preferably a hydroxyl group directly bonded to an aromatic ring such as a phenyl group. Furthermore, the carboxylic acid anhydride group may be a substituent obtained by removing any hydrogen atom from an acid anhydride such as maleic acid anhydride, phthalic acid anhydride, pyromellitic acid anhydride, or trimellitic acid anhydride.

The functional group represented by Q is preferably an unsaturated polymerizable group, an oxiranyl group, an oxetanyl group, or an aziridinyl group, and more preferably a (meth)acryl group, a (meth)acrylamide group, an oxiranyl group, or an oxetanyl group.

In the compound represented by any of General Formulae D1 to D16, a plurality of L's may be the same as or different from each other but is preferably the same as each other.

In the compound represented by any of General Formulae D1 to D16, a plurality of Q's may be the same as or different from each other.

The disk-like compound used in the resin composition is preferably a compound represented by any of General Formulae D1 to D16 that has one or more functional groups as Q, more preferably a compound represented by any of General Formulae D1 to D16 that has two or more functional groups as Q, and even more preferably a compound represented by any of General Formulae D1 to D16 that has three or more functional groups as Q. The disk-like compound is also preferably a compound represented by any of General Formulae D1 to D16 in which all Q's represent a functional group.

Meanwhile, for example, in a second aspect of the present invention in which the thermally conductive material is prepared without curing the composition containing a disk-like compound, the disk-like compound may be a compound represented by any of General Formulae D1 to D16 in which all Q's represent a hydrogen atom, a halogen atom, or a cyano group.

Specific examples of the disk-like compound include the compounds described in C. Destrade et al., Mol. Crysr. Liq. Cryst., vol. 71, page 111 (1981); The Chemical Society of Japan, Quarterly Review of Chemistry, No. 22, Chemistry of Liquid Crystal, chapter 5, paragraph 2 of chapter 10 (1994); B. Kohne et al., Angew. Chem. Int. Ed., 23, (1984), 82; J. Zhang et al., J. Am. Chem. Soc., vol. 116, page 2655 (1994); and JP4592225B. Examples of structures of preferred disk-like compounds include the triphenylene structure described in Angew. Chem. Int. Ed. 2012, 51, 7990-7993 or JP1995-306317A (JP-H07-306317A), the trisubstituted benzene structure described in JP2007-2220A or JP2010-244038A, and the like.

<Resin Composition>

In a first aspect of the present invention, it is preferable that the thermally conductive material contains a cured substance of the resin composition containing a disk-like compound. The thermally conductive material may be formed as a cured substance of the resin composition. It is also preferable that the thermally conductive material includes a layer formed of a cured substance of the resin composition. In a case where the thermally conductive material is formed as a cured substance, it is possible to obtain the thermally conductive material as a molded material. For example, the thermally conductive material can be obtained as a self-supported film including only a layer formed of a cured substance of the aforementioned resin composition.

The disk-like compound in the resin composition preferably has one or more functional groups. The disk-like compound more preferably includes one or more compounds which are selected from the group consisting of compounds represented by any of General Formulae D1 to D16 and have one or more functional groups. Particularly, the disk-like compound in the resin composition preferably has two or more functional groups and more preferably has three or more functional groups. The cured substance of the resin composition containing a monomer having three or more functional groups tends to have a high glass transition temperature and high heat resistance. Compared to a compound having a rod-like structure, the disk-like compound more likely to have three or more functional groups without affecting the characteristics of a mesogenic portion. The number of functional groups in the disk-like compound is preferably equal to or smaller than 8, and more preferably equal to or smaller than 6. It is preferable that the functional groups are selected from the group consisting of a (meth)acryl group, a (meth)acrylamide group, an oxiranyl group, an oxetanyl group, a hydroxyl group, an amino group, a thiol group, an isocyanate group, a carboxyl group, and a carboxylic acid anhydride group.

The resin composition may contain the disk-like compound as a main agent or as a curing agent. Furthermore, the resin composition may contain the disk-like compound as both the main agent and the curing agent. It is preferable that the resin composition contains the disk-like compound at least as the main agent.

In a case where the resin composition contains the disk-like compound as a main agent, it is preferable that the disk-like compound has functional groups selected from the group consisting of a (meth)acryl group, a (meth)acrylamide group, an oxiranyl group, and an oxetanyl group as functional groups. At this time, preferably two or more out of the functional groups included in the disk-like compound and more preferably all of the functional groups included in the disk-like compound may be functional groups selected from the group consisting of a (meth)acryl group, a (meth)acrylamide group, an oxiranyl group, and an oxetanyl group. In a case where the disk-like compound is contained in the resin composition as a main agent, the functional groups included in the disk-like compound are more preferably oxiranyl groups or oxetanyl groups, and even more preferably oxiranyl groups.

In a case where the resin composition contains the disk-like compound as a curing agent, it is preferable that the disk-like compound has functional groups selected from the group consisting of a hydroxyl group, an amino group, a thiol group, an isocyanate group, a carboxyl group, and a carboxylic acid anhydride group as functional groups. At this time, preferably two out of the functional groups included in the disk-like compound and more preferably all of the functional groups included in the disk-like compound may be functional groups selected from the group consisting of a hydroxyl group, an amino group, a thiol group, an isocyanate group, a carboxyl group, and a carboxylic acid anhydride group.

In a case where the resin composition contains the disk-like compound as a curing agent, the functional groups included in the disk-like compound are more preferably functional groups selected from the group consisting of a hydroxyl group, an amino group, and a carboxylic acid anhydride group, and more preferably amino groups.

As the disk-like compound used in the resin composition, a compound represented by General Formula (XI) or a compound represented by General Formula (XII) shown below is preferable.

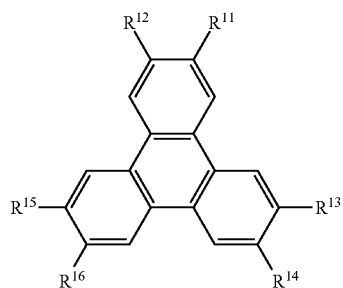

General Formula XI

In the formula, $R^{11}$, $R^{12}$, $R^{13}$, $R^{14}$, $R^{15}$, and $R^{16}$ each independently represent *—$X^{11}$-$L^{11}$-$P^{11}$ or *—$X^{12}$—$Y^{12}$, * represents a position bonded to a triphenylene ring, two or more among $R^{11}$, $R^{12}$, $R^{13}$, $R^{14}$, $R^{15}$, and $R^{16}$ represent *—$X^{11}$-$L^{11}$-$P^{11}$, $X^{11}$ and $X^{12}$ each independently represent a single bond, —O—, —C(=O)—, —OC(=O)—, —OC(=O)O—, —OC(=O)NH—, —OC(=O)S—, —C(=O)O—, —C(=O)NH—, —C(=O)S—, —NHC(=O)—, —NHC(=O)O—, —NHC(=O)NH—, —NHC(=O)S—, —S—, —SC(=O)—, —SC(=O)O—, —SC(=O)NH—, or —SC(=O)S—, $L^{11}$ represents a divalent linking group or a single bond, $P^{11}$ represents a substituent selected from the group consisting of a (meth)acryl group, a (meth)acrylamide group, an oxiranyl group, an oxetanyl group, a hydroxyl group, an amino group, a thiol group, an isocyanate group, a carboxyl group, and a carboxylic acid anhydride group, and $Y^{12}$ represents a hydrogen atom, a linear, branched, or cyclic alkyl group having 1 to 20 carbon atoms, or a group obtained in a case where one methylene group or two or more methylene groups in a linear, branched, or cyclic alkyl group having 1 to 20 carbon atoms are substituted with —O—, —S—, —NH—, —N(CH$_3$)—, —C(=O)—, —OC(=O)—, or —C(=O)O—.

It is preferable that three or more out of $R^{11}$, $R^{12}$, $R^{13}$, $R^{14}$, $R^{15}$, and $R^{16}$ represent *—$X^{11}$-$L^{11}$-$P^{11}$. Particularly, it is preferable that any one or more out of $R^{11}$ and $R^{12}$, any one or more out of $R^{13}$ and $R^{14}$, and any one or more out of $R^{15}$ and $R^{16}$ represent *—$X^{11}$-$L^{11}$-$P^{11}$. It is more preferable that all of $R^{11}$, $R^{12}$, $R^{13}$, $R^{14}$, $R^{15}$, and $R^{16}$ represent *—$X^{11}$-$L^{11}$-$P^{11}$. It is particularly preferable that all of $R^{11}$, $R^{12}$, $R^{13}$, $R^{14}$, $R^{15}$, and $R^{16}$ are the same as each other.

$X^{11}$ and $X^{12}$ each independently preferably represent —O—, —OC(=O)—, —OC(=O)O—, —OC(=O)NH—, —C(=O)O—, —C(=O)NH—, —NHC(=O)—, or NHC(=O)O—, more preferably represent —OC(=O)—, —C(=O)O—, —OC(=O)NH—, or C(=O)NH—, and particularly preferably represent —C(=O)O—.

$L^{11}$ represents a divalent linking group or a single bond linking $X^{11}$ and $P^{11}$ to each other. Examples of the divalent linking group include —O—, —OC(=O)—, —C(=O)O—, an alkylene group having 1 to 10 carbon atoms (preferably 1 to 8 carbon atoms and more preferably 1 to 6 carbon atoms), an arylene group having 6 to 20 carbon atoms (preferably 6 to 14 carbon atoms and more preferably 6 to 10 carbon atoms), a group obtained by combining these, and the like. Examples of the alkylene group having 1 to 10 carbon atoms include a methylene group, an ethylene group, a propylene group, a butylene group, a pentylene group, a hexylene group, and the like. Among these, a methylene group, an ethylene group, a propylene group, and a butylene group are preferable. Examples of the arylene group having 6 to 20 carbon atoms include a 1,4-phenylene group, a 1,3-phenylene group, a 1,4-naphthylene group, a 1,5-naphthylene group, an anthracenylene group, and the like. Among these, a 1,4-phenylene group is preferable.

Each of the alkylene group and the arylene group may have a substituent. The substituent includes substituents shown in a substituent group Y, which will be described later, an alkyl group, and an alkenyl group. The number of substituents is preferably 1 to 3, and more preferably 1. The substitution position is not particularly limited. As the substituent, a halogen atom or an alkyl group having 1 to 3 carbon atoms is preferable, and a methyl group is more preferable. It is also preferable that the alkylene group and the arylene group are unsubstituted. Particularly, it is preferable that the alkylene group is unsubstituted.

$P^{11}$ represents a functional group selected from the group consisting of a (meth)acryl group, a (meth)acrylamide group, an oxiranyl group, an oxetanyl group, a hydroxyl group, an amino group, a thiol group, an isocyanate group, a carboxyl group, and a carboxylic acid anhydride group. The preferred range of $P^{11}$ is the same as the preferred range of the functional group of the aforementioned disk-like compound.

In a case where $P^{11}$ represents a hydroxyl group, $L^{11}$ includes an arylene group, and it is preferable that arylene group is bonded to $P^{11}$.

$Y^{12}$ represents a hydrogen atom, a linear, branched, or cyclic alkyl group having 1 to 20 carbon atoms, or a group obtained in a case where one methylene group or two or more methylene groups in a linear, branched, or cyclic alkyl group having 1 to 20 carbon atoms are substituted with —O—, —S—, —NH—, —N(CH$_3$)—, —C(=O)—, —OC(=O)—, or —C(=O)O—. In a case where $Y^{12}$ represents a linear, branched, or cyclic alkyl group having 1 to 20 carbon atoms or a group obtained in a case where one methylene group or two or more methylene groups in a linear, branched, or cyclic alkyl group having 1 to 20 carbon atoms are substituted with —O—, —S—, —NH—, —N(CH$_3$)—, C(=O)—, —OC(=O)—, or —C(=O)O—, $Y^{12}$ may be substituted with a halogen atom. Examples of the linear or branched alkyl group having 1 to 20 carbon atoms include a methyl group, an ethyl group, a n-propyl group, an isopropyl group, a n-butyl group, an isobutyl group, a sec-butyl group, a tert-butyl group, a n-pentyl group, an isopentyl group, a neopentyl group, a 1,1-dimethylpropyl group, a n-hexyl group, an isohexyl group, a linear or branched heptyl group, an octyl group, a nonyl group, a decyl group, an undecyl group, and a dodecyl group. The number of carbon atoms in the cyclic alkyl group is preferably 3 to 20, and more preferably equal to or greater than 5. The number of carbon atoms in the cyclic alkyl group is preferably equal to or smaller than 10, more preferably equal to or smaller than 8, and even more preferably equal to or smaller than 6. Examples of the cyclic alkyl group include a cyclopropyl group, a cyclobutyl group, a cyclopentyl group, a cyclohexyl group, a cycloheptyl group, and a cyclooctyl group.

$Y^{12}$ is preferably a hydrogen atom, a linear, branched, or cyclic alkyl group having 1 to 20 carbon atoms, or an alkylene oxide group having 1 to 20 carbon atoms, and more preferably a linear or branched alkyl group having 1 to 12 carbon atoms or an ethylene oxide group or propylene oxide group having 1 to 20 carbon atoms.

Regarding specific examples of the compound represented by General Formula (XI) shown above, those described in paragraphs "0028" to "0036" in JP1995-281028A (JP-H07-281028A), JP1995-306317A (JP-H07-306317A), paragraphs "0016" to "0018" in JP2005-156822A, paragraphs "0067" to "0072" in JP2006-301614A, and Liquid Crystal Handbook (published on 2000 from MARUZEN Co., Ltd.), pp. 330 to 333.

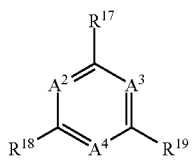

General Formula (XII)

In the formula, $A^2$, $A^3$, and $A^4$ each independently represent —CH= or N=, $R^{17}$, $R^{18}$, and $R^{19}$ each independently represent *—$X^{211}$—($Z^{21}$—$X^{212}$)$_{n21}$-$L^{21}$-$P^{21}$, or *—$X^{211}$—($Z^{22}$—$X^{222}$)$_{n22}$—$X^{22}$, * represents a position bonded to a central ring, two or more among $R^{17}$, $R^{18}$, and $R^{19}$ represent *—$X^{211}$—($Z^{21}$—$X^{212}$)$_{n21}$-$L^{21}$-$P^{21}$, $X^{211}$ and $X^{212}$ each independently represent a single bond, —O—, —C(=O)—, —OC(=O)—, —OC(=O)O—, —OC(=O)NH—, —OC(=O)S—, —C(=O)O—, —C(=O)NH—, —C(=O)S—, —NHC(=O)—, —NHC(=O)O—, —NHC(=O)NH—, —NHC(=O)S—, —S—, —SC(=O)—, —SC(=O)O—, —SC(=O)NH—, or —SC(=O)S—, $Z^{21}$ and $Z^{22}$ each independently represent an aromatic group as a 5-membered or 6-membered ring or a non-aromatic group as a 5-membered or 6-membered ring, $L^{21}$ represents a divalent linking group or a single bond linking $X^{212}$ and $P^{21}$ to each other, $P^{21}$ represents a substituent selected from the group consisting of a (meth)acryl group, a (meth)acrylamide group, an oxiranyl group, an oxetanyl group, a hydroxyl group, an amino group, a thiol group, an isocyanate group, a carboxyl group, and a carboxylic acid anhydride group, $Y^{22}$ represents a hydrogen atom, a linear, branched, or cyclic alkyl group having 1 to 20 carbon atoms, or a group obtained in a case where one methylene group or two or more methylene groups in a linear, branched, or cyclic alkyl group having 1 to 20 carbon atoms are substituted with —O—, —S—, —NH—, —N(CH$_3$)—, —C(=O)—, —OC(=O)—, or —C(=O)O—, $n^{21}$ and $n^{22}$ each independently represent an integer of 0 to 3, and in a case where each of $n^{21}$ and $n^{22}$ is equal to or greater than 2, a plurality of groups represented by $Z^{21}$—$X^{212}$ and $Z^{22}$—$X^{222}$ may be the same as or different from each other.

It is preferable that all of $R^{17}$, $R^{18}$, and $R^{19}$ represent *—$X^{211}$—($Z^{21}$—$X^{212}$)$_{n21}$-$L^{21}$-$P^{21}$. It is more preferable that all of $R^{17}$, $R^{18}$, and $R^{19}$ are the same as each other.

As $X^{211}$, $X^{212}$, $X^{221}$, and $X^{222}$, a single bond and —OC(=O)— are preferable.

$Z^{21}$ and $Z^{22}$ each independently represent an aromatic group as a 5-membered or 6-membered ring or a non-aromatic group as a 5-membered or 6-membered ring. Examples thereof include a 1,4-phenylene group, a 1,3-phenylene group, a heterocyclic group, and the like.

The aromatic group and the non-aromatic group described above may have a substituent. The substituent includes substituents shown in the substituent group Y, which will be described later, an alkyl group, and an alkenyl group. The number of substituents is preferably 1 or 2, and more preferably 1. The substitution position is not particularly limited. As the substituent, a halogen atom or a methyl group is preferable. As the halogen atom, a chlorine atom or a fluorine atom is preferable. It is also preferable that the aromatic group and the non-aromatic group are unsubstituted.

Examples of the heterocyclic ring include the following heterocyclic rings.

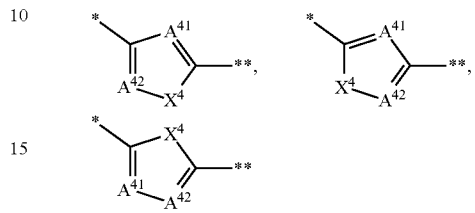

In the formulae, * represents a portion bonded to $X^{211}$, ** represents a portion bonded to $X^{212}$; $A^{41}$ and $A^{42}$ each independently represent methine or a nitrogen atom; and $X^4$ represents an oxygen atom, a sulfur atom, methylene, or imino.

It is preferable that at least one of $A^{41}$ and $A^{42}$ represents a nitrogen atom. It is more preferable that both of $A^{41}$ and $A^{42}$ represent a nitrogen atom. Furthermore, it is preferable that $X^4$ represents an oxygen atom.

$L^{21}$ each independently represents a divalent linking group or a single bond linking $X^{212}$ and $P^{21}$ to each other, and has the same definition as $L^{11}$ in General Formula (XI). As $L^{21}$, —O—, —OC(=O)—, —C(=O)O—, an alkylene group having 1 to 10 carbon atoms (preferably 1 to 8 carbon atoms and more preferably 1 to 6 carbon atoms), or a group obtained by combining these is preferable.

$P^{21}$ each independently represents a functional group, and has the same definition as $P^{11}$ in General Formula (XI). The preferred range of $P^{21}$ is the same as the preferred range of $P^{11}$ in General Formula (XI).

$Y^{22}$ each independently represents a hydrogen atom, a linear, branched, or cyclic alkyl group having 1 to 20 carbon atoms, or a group obtained in a case where one methylene group or two or more methylene groups in a linear, branched, or cyclic alkyl group having 1 to 20 carbon atoms are substituted with —O—, —S—, —NH—, —N(CH$_3$)—, —C(=O)—, —OC(=O)—, or —C(=O)O—. $Y^{22}$ has the same definition as $Y^{12}$ in General Formula (XI), and the preferred range thereof is also the same as the preferred range of $Y^{12}$ in General Formula (XI).

$n^{21}$ and $n^{22}$ each independently represent an integer of 0 to 3. $n^{21}$ and $n^{22}$ each independently preferably represent an integer of 1 to 3, and more preferably represent 2 or 3.

Regarding the details and specific examples of the compound represented by General Formula (XII), the description in paragraphs "0013" to "0077" in JP2010-244038A can be referred to, and the contents thereof are incorporated into the present specification.

It is preferable that the compound represented by General Formula (XI) or (XII) is a compound having a hydrogen bonding functional group, because then the stacking is enhanced by reducing the electron density, and hence a columnar aggregate is easily formed. Examples of the hydrogen bonding functional group include —OC(=O)NH—, —C(=O)NH—, —NHC(=O)—, —NHC(=O)O—, —NHC(=O)NH—, —NHC(=O)S—, SC(=O)NH—, and the like.

Specific examples of compounds particularly preferred as the compound represented by General Formula (XI) and the compound represented by General Formula (XII) include the following compounds.
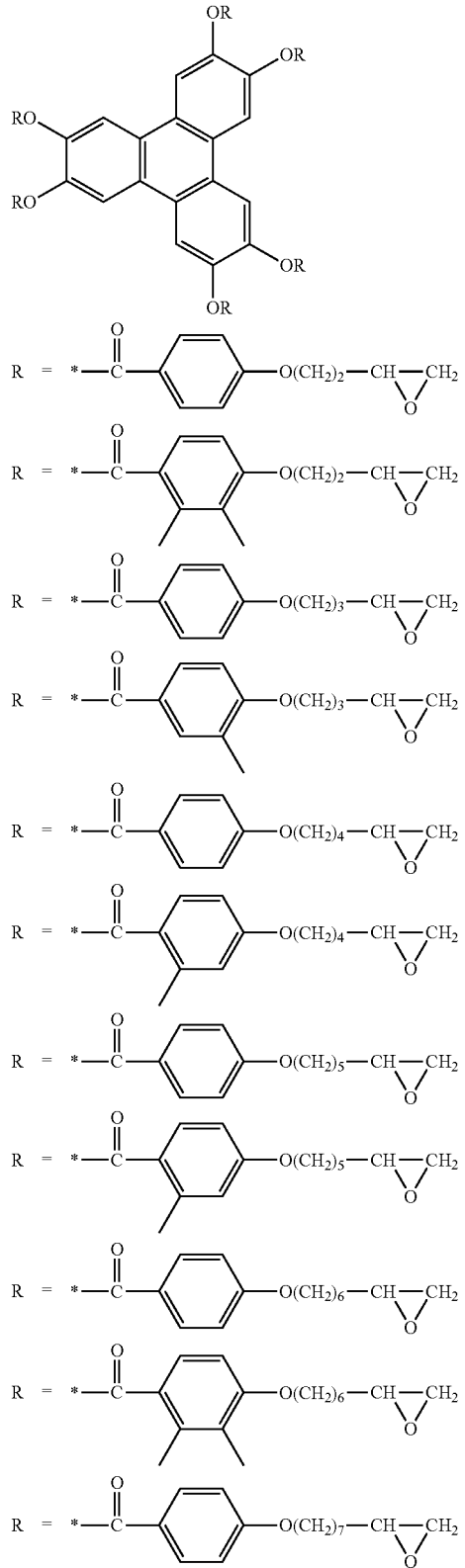
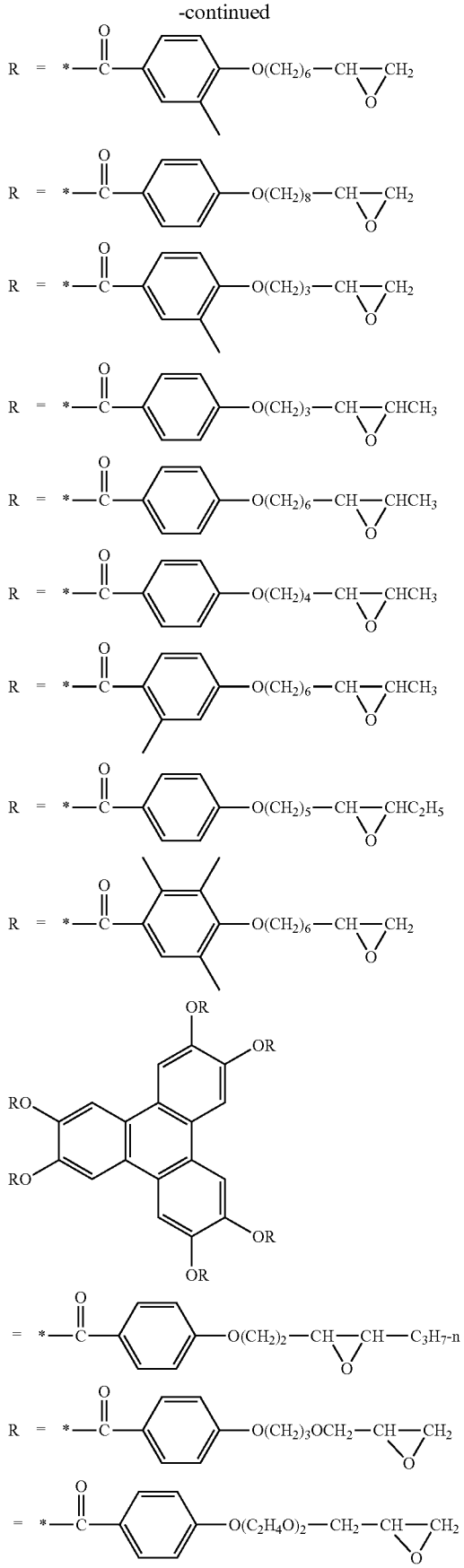

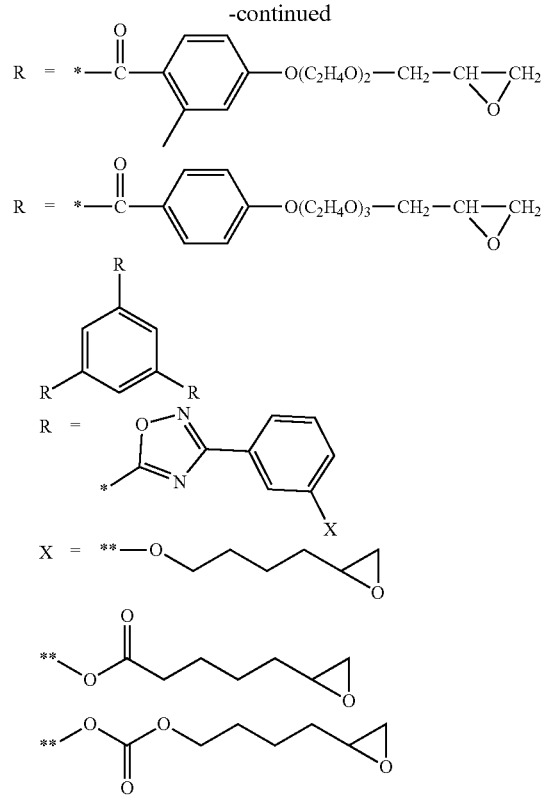
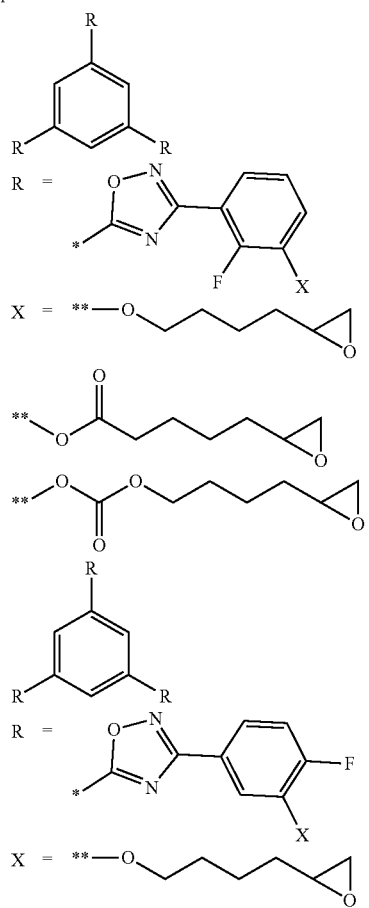
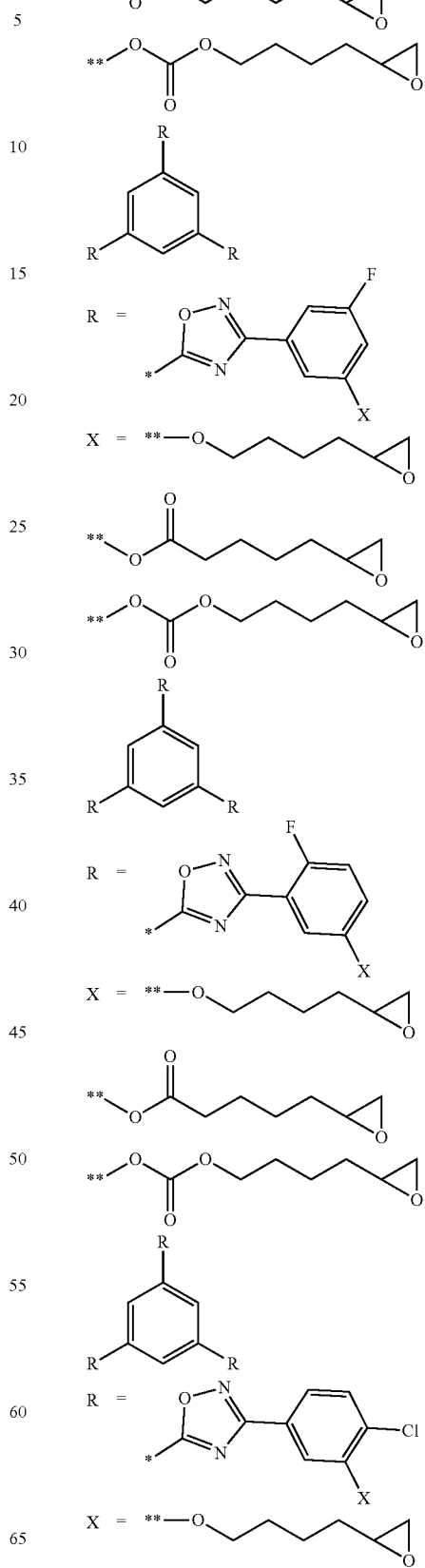
** represents a binding position. The same is true for the following description.

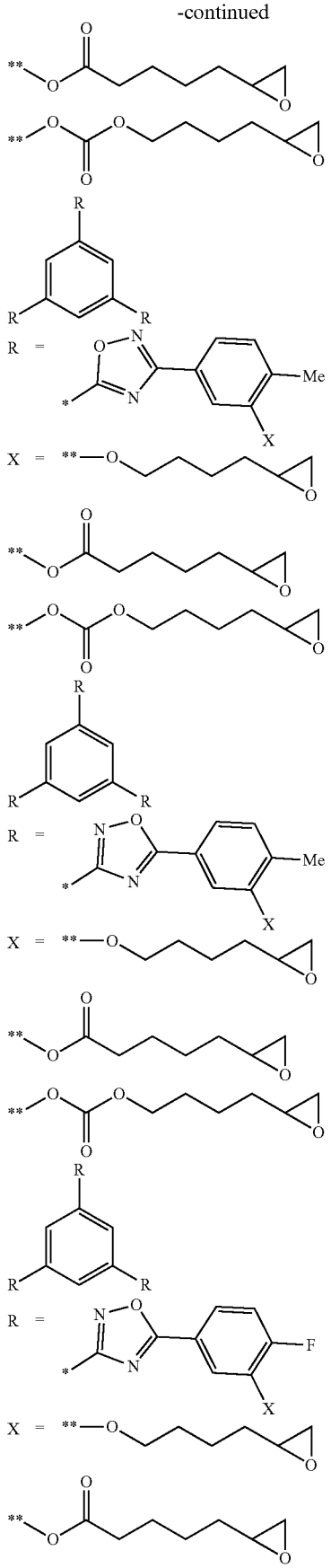
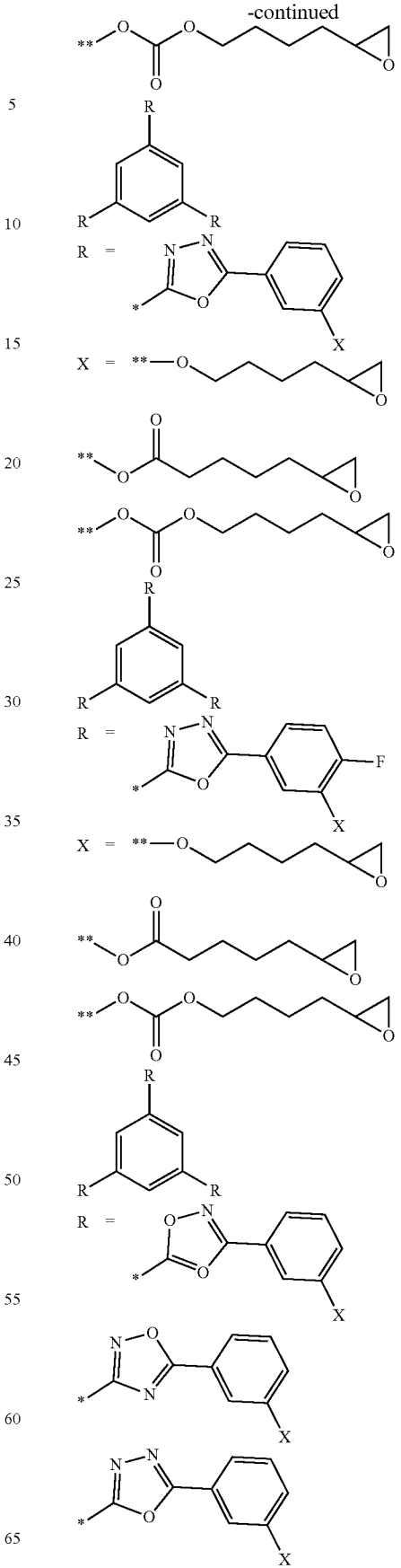

-continued
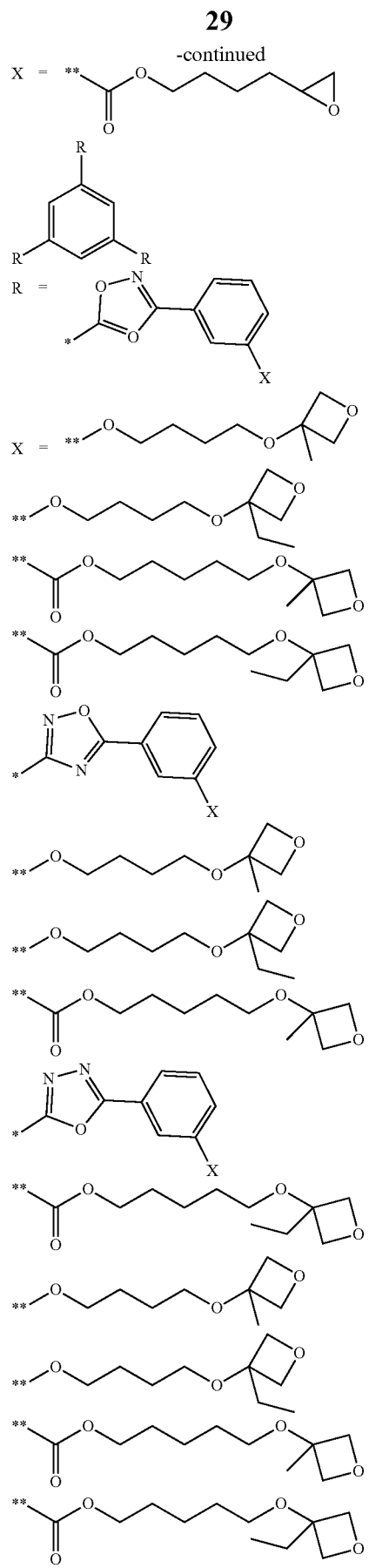
-continued
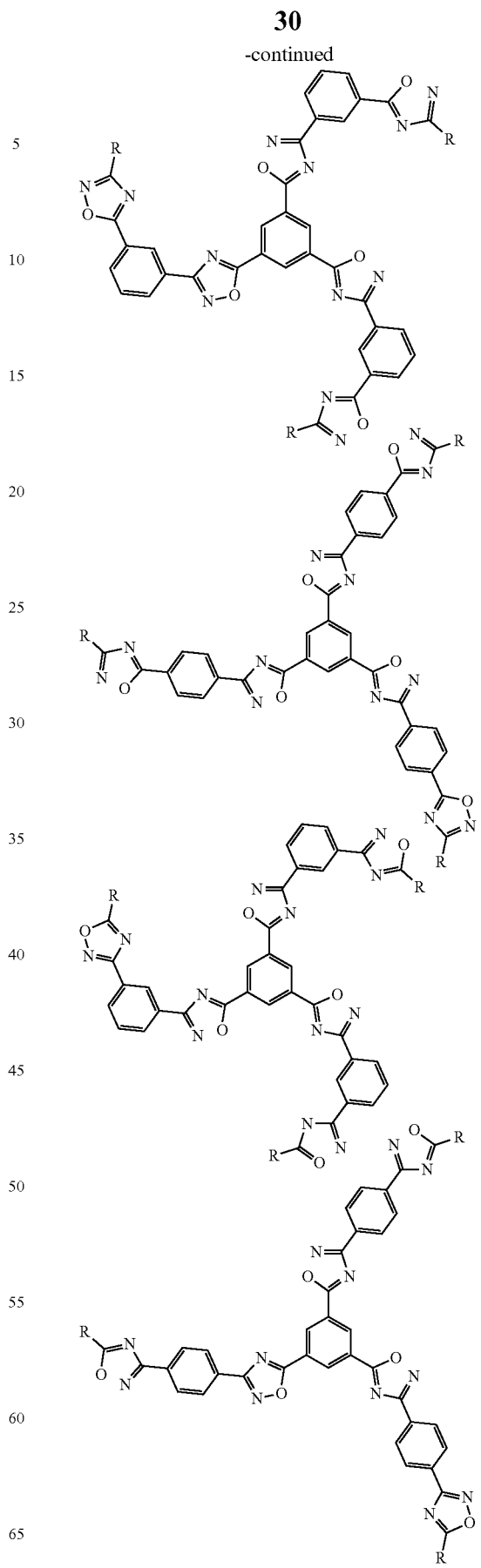

-continued

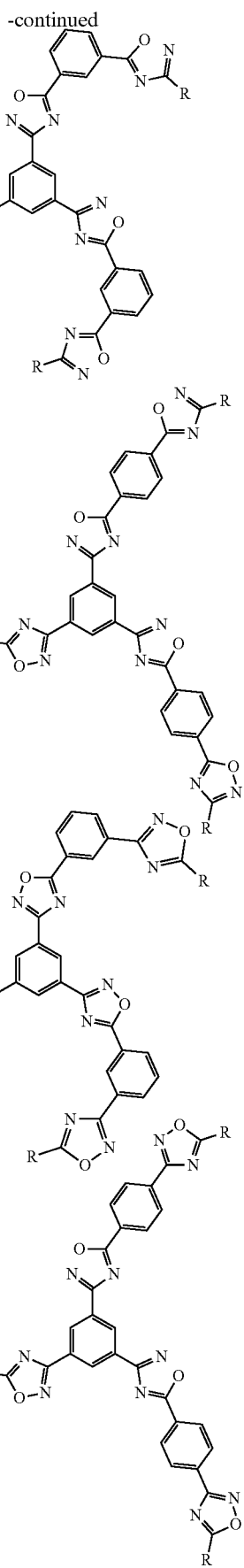

-continued

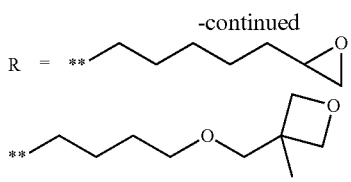

The compound represented by General Formula (XI) can be synthesized based on the methods described in JP1995-306317A (JP-H07-306317A), JP1995-281028A (JP-H07-281028A), JP2005-156822A, and JP2006-301614A.

The compound represented by General Formula (XII) can be synthesized based on the methods described in JP2010-244038A, JP2006-76992A, and JP2007-2220A.

The content of the disk-like compound in the resin composition with respect to the mass of total solid contents in the resin composition (mass of the solid contents except for a solvent) is preferably 10% by mass to 90% by mass, more preferably 20% by mass to 70% by mass, and even more preferably 30% by mass to 60% by mass.

[Another Curing Agent or Main Agent]

The resin composition may contain another curing agent or main agent that does not correspond to the disk-like compound.

The curing agent is not particularly limited as long as it is a compound having a functional group selected from the group consisting of a hydroxyl group, an amino group, a thiol group, an isocyanate group, a carboxyl group, or a carboxylic acid anhydride group. However, it is preferable to use a curing agent appropriate for the compound used as a main agent. For example, in a case where the resin composition contains a disk-like compound having an oxiranyl group as a main agent, it is preferable to use a curing agent which is another monomer having a hydroxyl group, an amino group, or a carboxylic acid anhydride group.

The curing agent preferably has two or more functional groups described above and more preferably has two functional groups described above.

Examples of the curing agent which is not a disk-like compound include the curing agent for an epoxy resin described in "0028" in JP4118691B, the amine-based curing agent, the phenol-based curing agent, or the acid anhydride-based curing agent described in "0016" to "0018" in JP2008-13759A, the amine-based curing agent and the phenol-based curing agent described in "0101" to "0150" in JP2013-227451A, and the like.

Among these, the amine-based curing agent is particularly preferable, and examples of compounds preferred as the amine-based curing agent include 4,4'-diaminodiphenylmethane, 4,4'-diaminodiphenylether, 4,4'-diaminodiphenylsulfone, 4,4'-diamino-3,3'-dimethoxybiphenyl, 4,4'-diaminophenylbenzoate, 1,5-diaminonaphthalene, 1,3-diaminonaphthalene, 1,4-diaminonaphthalene, 1,8-diaminonaphthalene, and the like.

The main agent is not particularly limited as long as it is a monomer having a functional group selected from the group consisting of a (meth)acryl group, a (meth)acrylamide group, an oxiranyl group, and an oxetanyl group. However, it is preferable to use a main agent appropriate for the compound used as a curing agent. For example, in a case where the resin composition contains a disk-like compound, which has a hydroxyl group, an amino group, or a carboxylic acid anhydride group as a functional group, as a curing agent, it is preferable to use a main agent having an oxiranyl group.

It is preferable that the main agent has two or more functional groups described above.

Examples of the main agent which is not a disk-like compound include various known epoxy resin monomers or acryl resin monomers. For example, it is also possible to use the epoxy resin monomer and the acryl resin monomer described in "0028" in JP4118691B, the epoxy compound described in "0006" to "0011" in JP2008-13759A, the epoxy resin mixture described in "0032" to "0100" in JP2013-227451A, and the like.

The content of the curing agent, which is not a disk-like compound, in the resin composition with respect to the mass of total solid contents in the resin composition (mass of the solid contents except for a solvent) is preferably 90% by mass to 10% by mass, and more preferably 80% by mass to 30% by mass. The content of the main agent, which is not a disk-like compound, in the resin composition with respect to the mass of total solid contents in the resin composition (mass of the solid contents except for a solvent) is preferably 50% by mass to 0% by mass, and more preferably 30% by mass to 0% by mass.

[Curing Accelerator]

The resin composition may contain a curing accelerator. Examples of the curing accelerator include triphenylphosphine, 2-ethyl-4-methylimidazole, a boron trifluoride amine complex, 1-benzyl-2-methylimidazole, and those described in paragraph "0052" in JP2012-67225A.

[Polymerization Initiator]

Particularly, in a case where the resin composition contains a disk-like compound having a (meth)acryl group or a (meth)acrylamide group as a functional group or another main agent having a (meth)acryl group or a (meth)acrylamide group, it is also preferable that the resin composition contains the polymerization initiator described in paragraph "0062" in JP2010-125782A and paragraph "0054" in JP2015-052710A.

The content of the curing accelerator and the polymerization initiator in the resin composition with respect to the mass of total solid contents in the resin composition (mass of the solid contents except for a solvent) is preferably 20% by mass to 0.1% by mass, and more preferably 10% by mass to 1% by mass.

<Inorganic Substance>

The composition containing a disk-like compound may contain an inorganic substance. By using a composition to which an inorganic substance is added as a filler, a thermally conductive material having higher thermal conductivity can be prepared. The composition may contain one kind of inorganic substance or two or more kinds of inorganic substances. The inorganic substance may be contained as it is in the composition or may be contained in the composition as a surface-modified inorganic substance whose surface is modified with a surface modifier which will be described later.

As the inorganic substance, any of inorganic substances which have been used in an inorganic filler of a thermally conductive material in the related art may be used. As the inorganic substance, an inorganic oxide or an inorganic nitride is preferable. The inorganic substance may be an inorganic oxynitride. The shape of the inorganic substance is not particularly limited, and may be granular, film-like, or plate-like. The granules may have a rice grain shape, a spherical shape, a cubical shape, a spindle shape, a scale shape, an aggregated shape, or an amorphous shape.

The inorganic oxide is not particularly limited, and examples thereof include zirconium oxide ($ZrO_2$), titanium oxide ($TiO_2$), silicon oxide ($SiO_2$), aluminum oxide ($Al_2O_3$), iron oxide ($Fe_2O_3$, FeO, or $Fe_3O_4$), copper oxide (CuO or $Cu_2O$), zinc oxide (ZnO), yttrium oxide ($Y_2O_3$), niobium oxide ($Nb_2O_5$), molybdenum oxide ($MoO_3$), indium oxide ($In_2O_3$ or $In_2O$), tin oxide ($SnO_2$), tantalum oxide ($Ta_2O_5$), tungsten oxide ($WO_3$ or $W_2O_5$), lead oxide (PbO or $PbO_2$), bismuth oxide ($Bi_2O_3$), cerium oxide ($CeO_2$ or $Ce_2O_3$), antimony oxide ($Sb_2O_3$ or $Sb_2O_5$), germanium oxide ($GeO_2$ or GeO), lanthanum oxide ($La_2O_3$), ruthenium oxide ($RuO_2$), and the like.

The above inorganic oxides may be used singly, or plural kinds thereof may be used in combination.

The inorganic oxide is preferably titanium oxide, aluminum oxide, or zinc oxide.

The inorganic oxide may be an oxide that is generated in a case where a metal prepared as a non-oxide is oxidized due to the environment or the like.

The inorganic nitride is not particularly limited, and examples thereof include boron nitride (BN), carbon nitride ($C_3N_4$), silicon nitride ($Si_3N_4$), gallium nitride (GaN), indium nitride (InN), aluminum nitride (AlN), chromium nitride ($Cr_2N$), copper nitride ($Cu_3N$), iron nitride ($Fe_4N$), iron nitride ($Fe_3N$), lanthanum nitride (LaN), lithium nitride ($Li_3N$), magnesium nitride ($Mg_3N_2$), molybdenum nitride ($Mo_2N$), niobium nitride (NbN), tantalum nitride (TaN), titanium nitride (TiN), tungsten nitride ($W_2N$), tungsten nitride ($WN_2$), yttrium nitride (YN), zirconium nitride (ZrN), and the like.

The above inorganic nitrides may be used singly, or plural kinds thereof may be used in combination.

The inorganic nitride preferably contains aluminum, boron, or silicon, and is preferably aluminum nitride, boron nitride, or silicon nitride.

In a case where the composition containing a disk-like compound contains an inorganic substance, the content of the inorganic substance with respect to the mass of solid contents in the composition (mass of the solid contents except for a solvent) containing a disk-like compound is preferably equal to or greater than 30% by mass, more preferably equal to or greater than 40% by mass, and even more preferably equal to or greater than 50% by mass. The content of the inorganic substance is preferably equal to or smaller than 90% by mass, more preferably equal to or smaller than 80% by mass, and even more preferably equal to or smaller than 70% by mass.

<Surface Modifier>

The composition containing a disk-like compound may contain a surface modifier.

In the present specification, "surface-modified" means a state where an organic substance is adsorbed onto at least a portion of the surface of an inorganic substance. The way the organic substance is adsorbed is not particularly limited, and the organic substance may be in a bonded state. That is, "surface-modified" includes a state where an organic group obtained by the dissociation of a portion of an organic substance forms a bond with the surface of an inorganic substance. The bond may be any one of a covalent bond, a coordinate bond, an ionic bond, a hydrogen bond, a van der Waals bond, and a metallic bond, but is preferably a covalent bond. In the "surface-modified" state, a monolayer may be formed on at least a portion of the surface. The monolayer is a monolayer film formed by the chemical adsorption of organic molecules, and is known as Self-Assembled Monolayer (SAM). The organic substance is a so-called organic compound, and means a carbon atom-containing compound excluding carbon monoxide, carbon dioxide, carbonate, and the like that are customarily classified as an inorganic compound. In the present specification, the "surface-modified" state may be established on only a portion of the surface of an inorganic substance or on the entirety of the surface of an inorganic substance.

In the present specification, "surface-modified inorganic substance" means an inorganic substance whose surface is modified with a surface modifier, that is, a substance in which an organic substance is adsorbed onto the surface of an inorganic substance.

As the surface modifier, it is possible to use surface modifiers known in the related art, such as a carboxylic acid of a long-chain fatty acid or the like, an organic phosphonic acid, an organic phosphoric acid ester, and an organic silane molecule (silane coupling agent). In addition, for example, the surface modifiers described in JP2009-502529A, JP2001-192500A, and JP4694929B may also be used.

Furthermore, it is also preferable to use a boric acid compound or an aldehyde compound described below.

(Boronic Acid Compound)

The boronic acid compound has a structure in which one or more hydroxyl groups of boric acid are substituted with an organic group such as a hydrocarbon group. By being adsorbed onto an inorganic substance generally through the boron portion, the boronic acid compound modifies the surface of an inorganic substance. In a case where the boronic acid compound is used as a surface modifier, as the inorganic substance, an inorganic nitride is preferable, and aluminum nitride, boron nitride, or silicon nitride is more preferable.

The boronic acid compound may be a compound represented by General Formula I, for example.

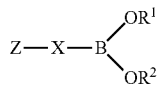

General Formula I

In General Formula I, Z represents an amino group, a thiol group, a hydroxyl group, an isocyanate group, a carboxyl group, a carboxylic acid anhydride group, a polymerizable group, a hydrogen atom, a halogen atom, a quaternary ammonium group or a salt thereof, or a quaternary pyridinium group or a salt thereof. The quaternary pyridinium group may have a substituent.

X represents a divalent linking group. X contains at least one linking group A selected from the group consisting of a divalent aliphatic hydrocarbon group which may have a substituent, an arylene group which may have a substituent, and a heteroarylene group which may have a substituent. X may contain one or more linking groups B selected from the group consisting of —O—, —CO—, —NH—, —CO—NH—, COO—, and —O—COO—. That is, X is the linking group A, a linking group constituted with a combination of two or more linking groups A, or a linking group constituted with a combination of one or more linking groups A and one or more linking groups B.

$R^1$ and $R^2$ each independently represent a hydrogen atom, an aliphatic hydrocarbon group which may have a substituent, an aryl group which may have a substituent, or a heteroaryl group which may have a substituent.

$R^1$ and $R^2$ may be linked through an alkylene linking group, an arylene linking group, or a linking group as a combination of an alkylene linking group and an arylene linking group.

The divalent aliphatic hydrocarbon group which may have a substituent includes an alkylene group which may have a substituent and an alkenylene group which may have a substituent.

The aliphatic hydrocarbon group which may have a substituent that is represented by each of $R^1$ and $R^2$ include an alkyl group which may have a substituent, an alkenyl group which may have a substituent, and an alkynyl group which may have a substituent.

In the present specification, in a case where a group is described as "alkyl group", the alkyl group may be linear, branched, or cyclic. The number of carbon atoms in the alkyl group is preferably 1 to 30, and more preferably 2 to 10. Specific examples of the alkyl group include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, a sec-butyl group, a tert-butyl group, an isopentyl group, a neopentyl group, a 1-methylbutyl group, an isohexyl group, a 2-methylhexyl group, a cyclopentyl group, a cyclohexyl group, a 1-adamantyl group, a 2-norbornyl group, and the like. The above description relating to the alkyl group is also applied to other groups such as an alkyl group-containing alkoxy group. The alkylene group is a group obtained by removing a certain hydrogen atom from the alkyl group, and examples of the alkylene group include the groups obtained by removing a certain hydrogen atom from each of the aforementioned examples of the alkyl group.

In the present specification, in a case where a group is described as "alkenyl group", the alkenyl group may be linear, branched, or cyclic. The number of carbon atoms in the alkenyl group is preferably 2 to 30, and more preferably 2 to 10. Specific examples of the alkenyl group include a vinyl group, a 1-propenyl group, a 1-butenyl group, a 1-methyl-1-propenyl group, a 1-cyclopentenyl group, a 1-cyclohexenyl group, and the like. The above description relating to the alkenyl group is also applied to other groups containing the alkenyl group. The alkenylene group is a group obtained by removing a certain hydrogen atom from the alkenyl group, and examples of the alkenylene group include the groups obtained by removing a certain hydrogen atom from each of the aforementioned examples of the alkenyl group.

The number of carbon atoms in the alkynyl group mentioned in the present specification is preferably 2 to 30, and more preferably 2 to 10. Specific examples of the alkynyl group include an ethynyl group, a 1-propynyl group, a 1-butynyl group, a 1-octynyl group, and the like.

In the present specification, in a case where a group is described as "aryl group", the aryl group may be a monocyclic group or a ring-fused group containing two or more rings. The number of carbon atoms in the aryl group is preferably 5 to 18, and more preferably 5 to 10. Specific examples of the aryl group include a phenyl group, a naphthyl group, an anthryl group, a phenanthryl group, an indenyl group, an acenaphthenyl group, a fluorenyl group, a pyrenyl group, and the like. The arylene group is a group obtained by removing any hydrogen atom from the aryl group, and examples of the arylene group include the groups obtained by removing any hydrogen atom from each of the aforementioned examples of the aryl group.

Examples of the heteroaryl group mentioned in the present specification include heteroaryl groups obtained by removing one hydrogen atom on a heterocyclic aromatic ring containing one or more hetero atoms selected from the group consisting of a nitrogen atom, an oxygen atom, and a sulfur atom. Specific examples of the heterocyclic aromatic ring containing one or more hetero atoms selected from the group consisting of a nitrogen atom, an oxygen atom, and a sulfur atom include pyrrole, furan, thiophene, pyrazole, imidazole, triazole, oxazole, isoxazole, oxadiazole, thiazole, thiadiazole, indole, carbazole, benzofuran, dibenzofuran, thianaphthene, dibenzothiophene, indazole benzimidazole, anthranyl, benzisoxazole, benzoxazole, benzothiazole, purine, pyridine, pyridazine, pyrimidine, pyrazine, triazine, quinoline, acridine, isoquinoline, phthalazine, quinazoline, quinoxaline, naphthyridine, phenanthroline, pteridine, and the like. The heteroarylene group is a group obtained by removing a certain hydrogen atom from the heteroaryl group, and examples of the heteroarylene group include the groups obtained by removing a certain hydrogen atom from each of the aforementioned examples of the heteroaryl group.

In the present specification, in a case where the description of "may have a substituent" appears, the type of a substituent, the position of a substituent, and the number of substituents are not particularly limited. The number of substituents may, for example, be 1, 2, 3, or greater. Examples of the substituent include a group of monovalent nonmetallic atoms excluding hydrogen, and the substituent can be selected from the following substituent group Y for example.

Substituent group Y: halogen atom (—F, —Br, —Cl, or —I), a hydroxyl group, an alkoxy group, an aryloxy group, a mercapto group, an alkylthio group, an arylthio group, an alkyldithio group, an aryldithio group, an amino group, a N-alkylamino group, a N,N-dialkylamino group, a N-arylamino group, a N,N-diarylamino group, a N-alkyl-N-arylamino group, an acyloxy group, a carbamoyloxy group, a N-alkylcarbamoyloxy group, a N-arylcarbamoyloxy group, a N,N-dialkylcarbamoyloxy group, a N,N-diarylcarbamoyloxy group, a N-alkyl-N-arylcarbamoyloxy group, an alkylsulfoxy group, an arylsulfoxy group, an acylthio group, an acylamino group, a N-alkylacylamino group, a N-arylacylamino group, a ureide group, a N'-alkylarylureide group, a N',N'-dialkylureide group, a N'-arylureide group, a N',N'-diarylureide group, a N'-alkyl-N-arylureide group, a N-alkylureide group, a N-arylureide group, a N'-alkyl-N-alkylureide group, a N'-alkyl-N-arylureide group, a N',N'-dialkyl-N-alkylureide group, a N',N'-dialkyl-N-arylureide group, a N'-aryl-N-alkylureide group, a N'-aryl-N-arylureide group, a N',N'-diaryl-N-alkylureide group, a N',N'-diaryl-N-arylureide group, a N'-alkyl-N'-aryl-N-alkylureide group, a N'-alkyl-N'-aryl-N-arylureide group, an alkoxycarbonylamino group, an aryloxycarbonylamino group, a N-alkyl-N-alkoxycarbonylamino group, a N-alkyl-N-aryloxycarbonylamino group, a N-aryl-N-alkoxycarbonylamino group, a N-aryl-N-aryloxycarbonylamino group, a formyl group, an acyl group, a carboxyl group and a conjugated base group thereof, an alkoxycarbonyl group, an aryloxycarbonyl group, a carbamoyl group, a N-alkylcarbamoyl group, a N,N-dialkylcarbamoyl group, a N-arylcarbamoyl group, a N,N-diarylcarbamoyl group, a N-alkyl-N-arylcarbamoyl group, an alkylsufinyl group, an arylsulfinyl group, an alkylsulfonyl group, an arylsulfonyl group, a sulfo group (—SO$_3$H) and a conjugated base group thereof, an alkoxysulfonyl group, an aryloxysulfonyl group, a sulfinamoyl group, a N-alkylsulfinamoyl group, a N,N-dialkylsulfinamoyl group, a N-arylsulfinamoyl group, a N,N-diarylsulfinamoyl group, a N-alkyl-N-arylsulfinamoyl group, a sulfamoyl group, a N-alkylsulfamoyl group, a N,N-dialkylsulfamoyl group, a N-arylsulfamoyl group, a N,N-diarylsulfamoyl group, a N-alkyl-N-arylsulfamoyl group, a N-acylsulfamoyl group and a conjugated base group thereof, a N-alkylsulfonylsulfamoyl group (—SO$_2$NHSO$_2$(alkyl)) and a conjugated base group thereof, a N-arylsulfonylsulfamoyl group (—SO$_2$NHSO$_2$(aryl)) and a conjugated base group thereof, a N-alkylsulfonylcarbamoyl group (—CONHSO$_2$(alkyl)) and a conjugated base group thereof, a N-arylsulfonylcarbamoyl group (—CONHSO$_2$(aryl)) and a conjugated base group thereof, an alkoxysilyl group (—Si(Oalkyl)$_3$), an aryloxysilyl group (—Si(Oaryl)$_3$), a hydroxysilyl group (—Si(OH)$_3$) and a conjugated base group thereof, a phosphono group (—PO$_3$H$_2$) and a conjugated base group thereof, a dialkylphosphono group (—PO$_3$(alkyl)$_2$), a diarylphosphono group (—PO$_3$(aryl)$_2$), an alkylarylphosphono group (—PO$_3$(alkyl)(aryl)), a monoalkylphosphono group (—PO$_3$H(alkyl)) and a conjugated base group thereof, a monoarylphosphono group (—PO$_3$H(aryl)) and a conjugated base group thereof, a phosphonooxy group (—OPO$_3$H$_2$) and a conjugated base group thereof, a dialkylphosphonooxy group (—OPO$_3$(alkyl)$_2$), a diarylphosphonooxy group (—OPO$_3$(aryl)$_2$), an alkylarylphosphonooxy group (—OPO$_3$(alkyl)(aryl)), a monoalkylphosphonooxy group (—OPO$_3$H(alkyl)) and a conjugated base group thereof, a monoarylphosphonooxy group (—OPO$_3$H(aryl)) and a conjugated base group thereof, a cyano group, a nitro group, an aryl group, an alkenyl group, and an alkynyl group.

These substituents may form a ring with each other if possible or may form a ring by being bonded to the group substituted with the substituents.

Examples of the polymerizable group include a (meth)acrylate group, a styryl group, a vinyl ketone group, a butadiene group, a vinyl ether group, an oxiranyl group, an aziridinyl group, an oxetane group, and the like. Among these, a (meth)acrylate group, a styryl group, an oxiranyl group, or an oxetane group is more preferable, and a (meth)acrylate group or an oxiranyl group is even more preferable.

$R^1$ and $R^2$ in General Formula I are preferably a hydrogen atom.

X in General Formula I is preferably a linking group containing a phenylene group which may have at least one substituent, and more preferably a linking group having a partial structure to which a phenylene group, which may have two substituents, is linked through —COO—. Furthermore, X is preferably a linking group containing an unsubstituted phenylene group. It is particularly preferable that the unsubstituted phenylene group is directly bonded to a boron atom of the boronic acid.

Z in General Formula I is preferably an amino group, a thiol group, a hydroxyl group, a (meth)acrylate group, an oxiranyl group, or a hydrogen atom.

The boronic acid compound preferably has a chain-like structure, because then a monolayer is easily formed.

Preferred examples of the boronic acid compound represented by General Formula I will be shown below, but the present invention is not limited thereto.

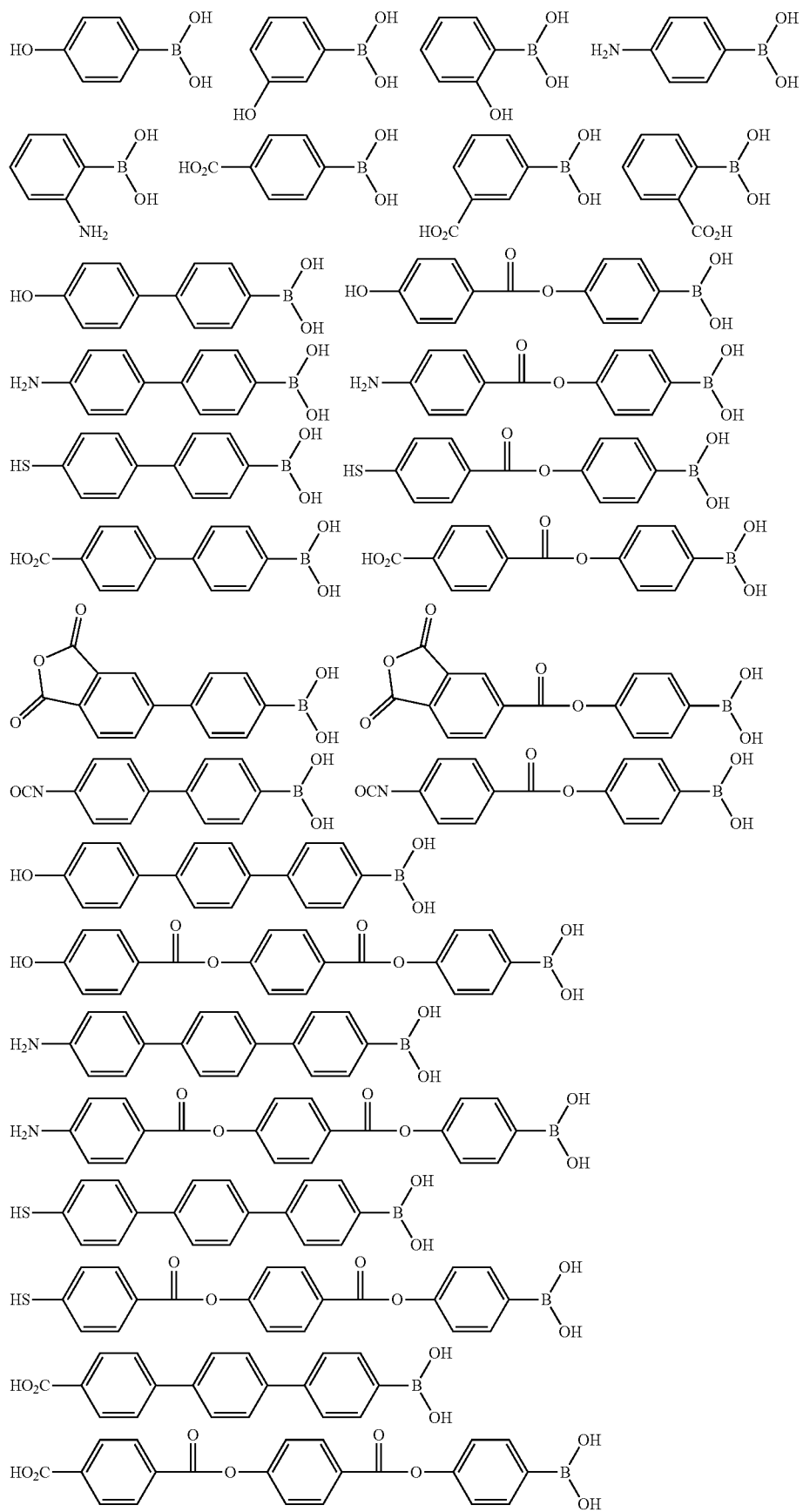

-continued
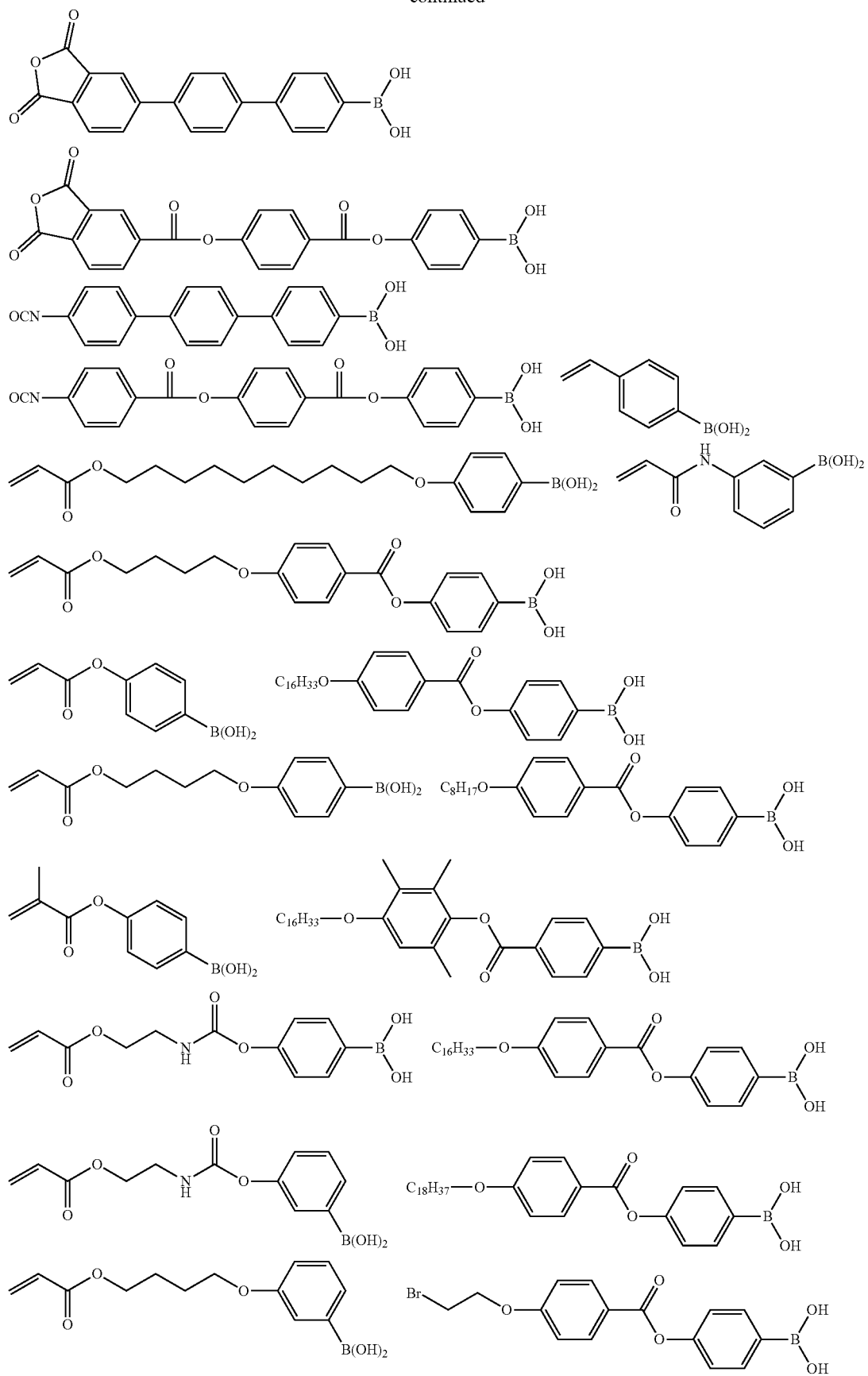

-continued
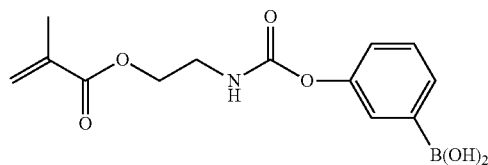
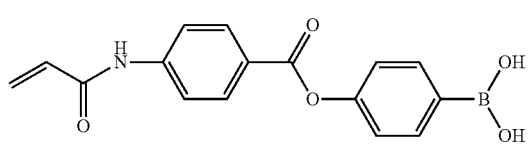
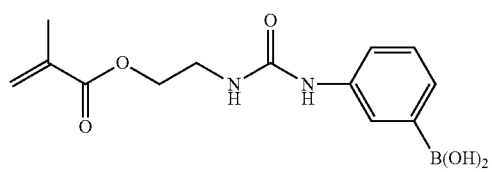
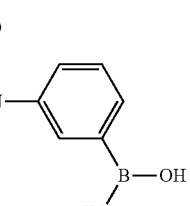
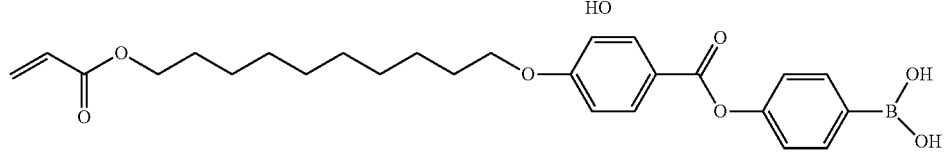
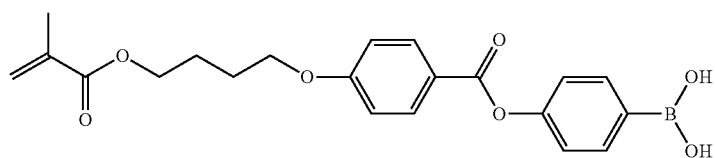
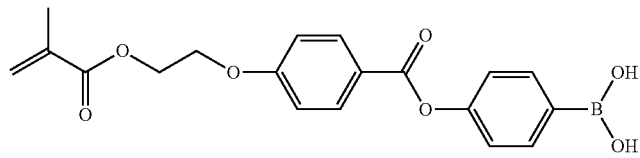
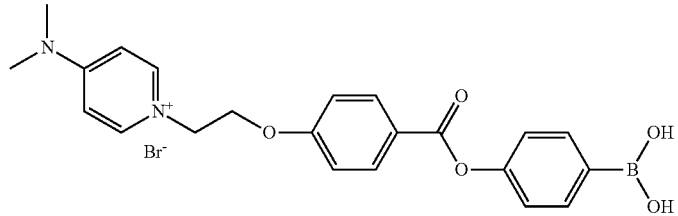
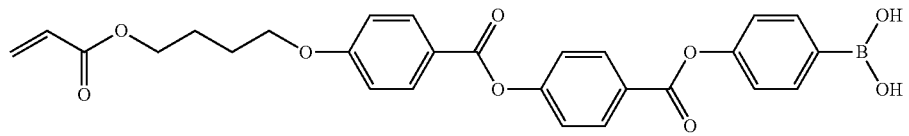
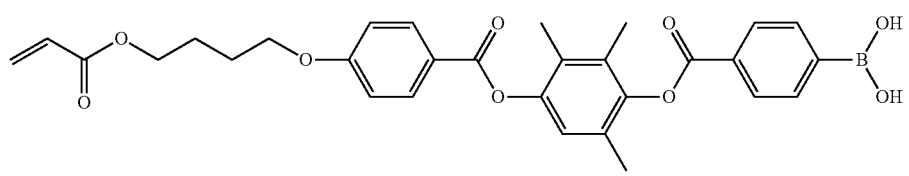
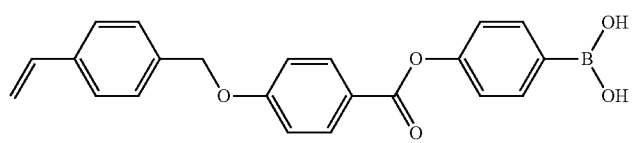

-continued
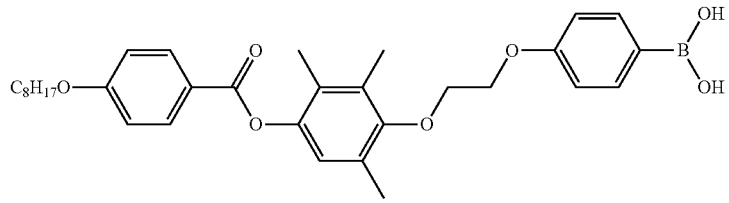
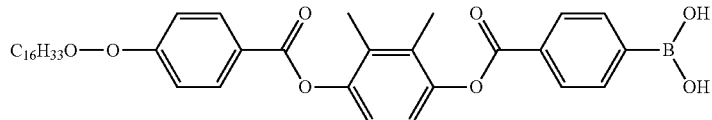
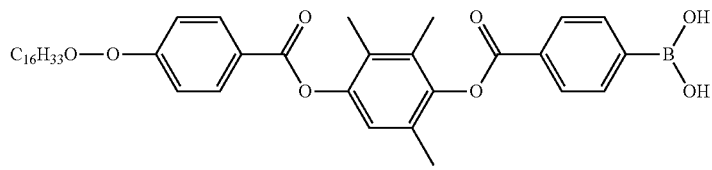
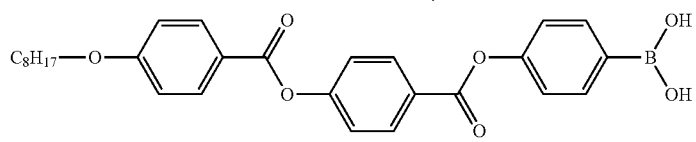
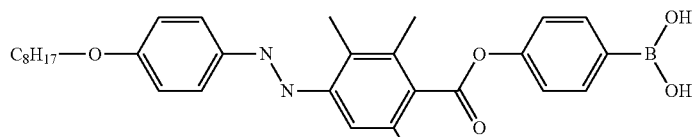
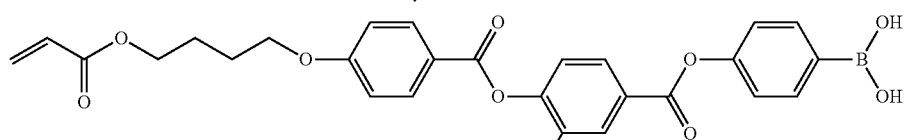
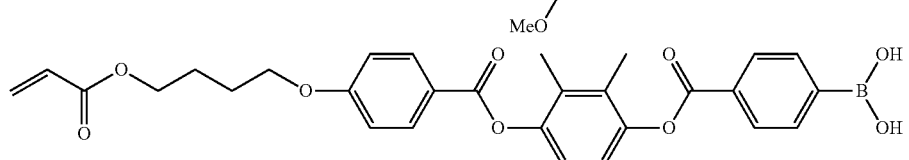
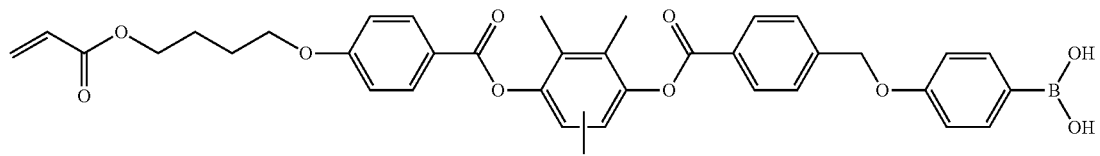
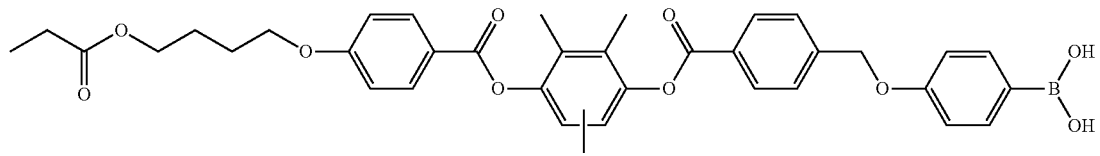
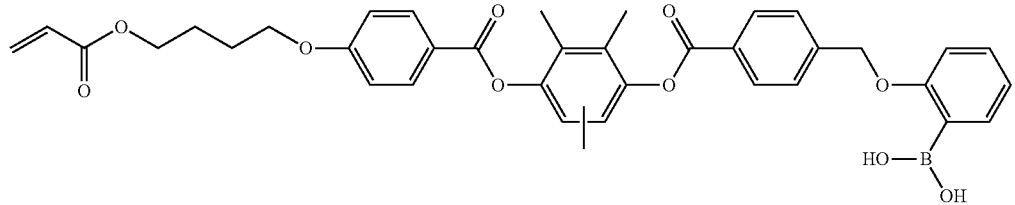

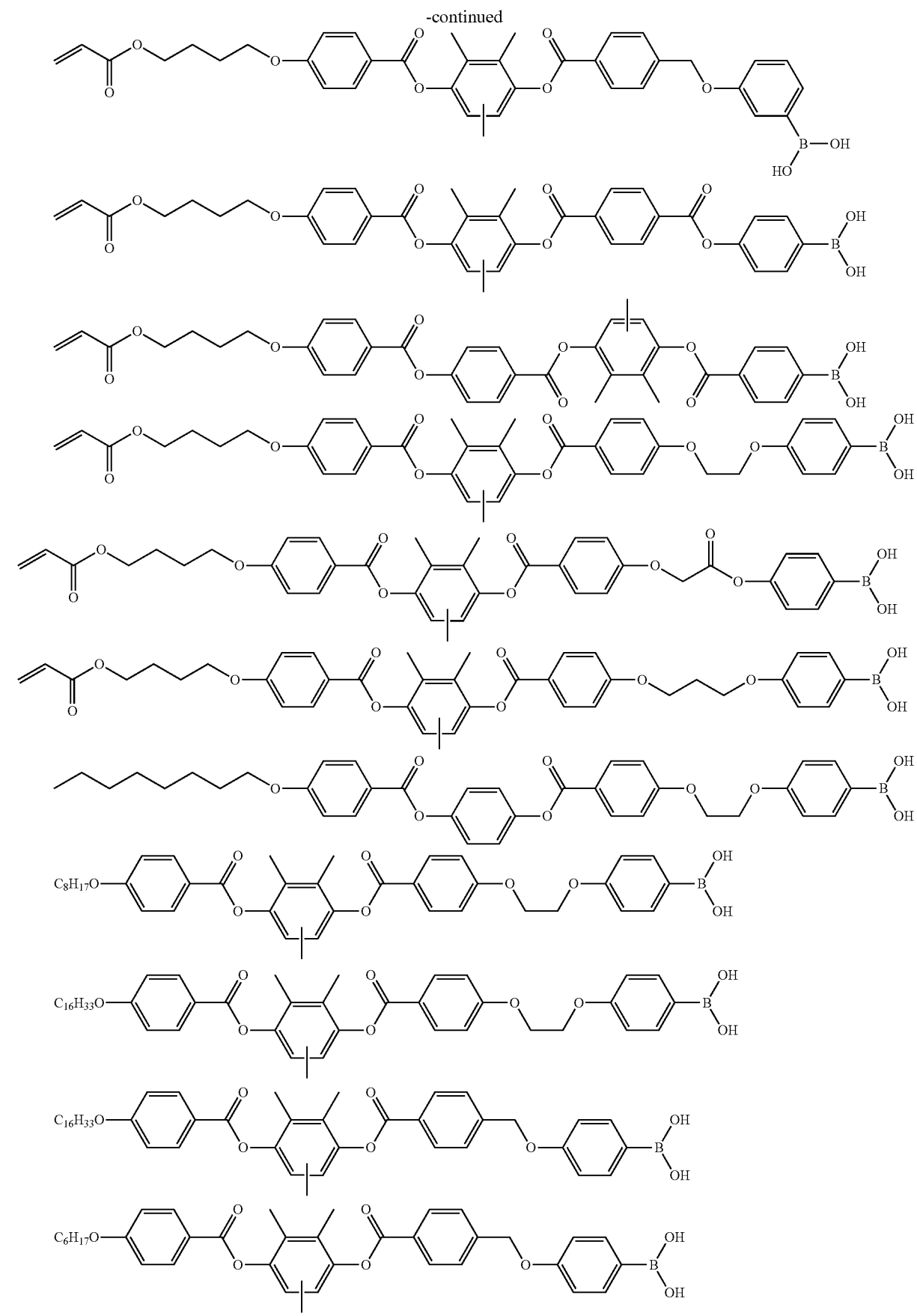

-continued

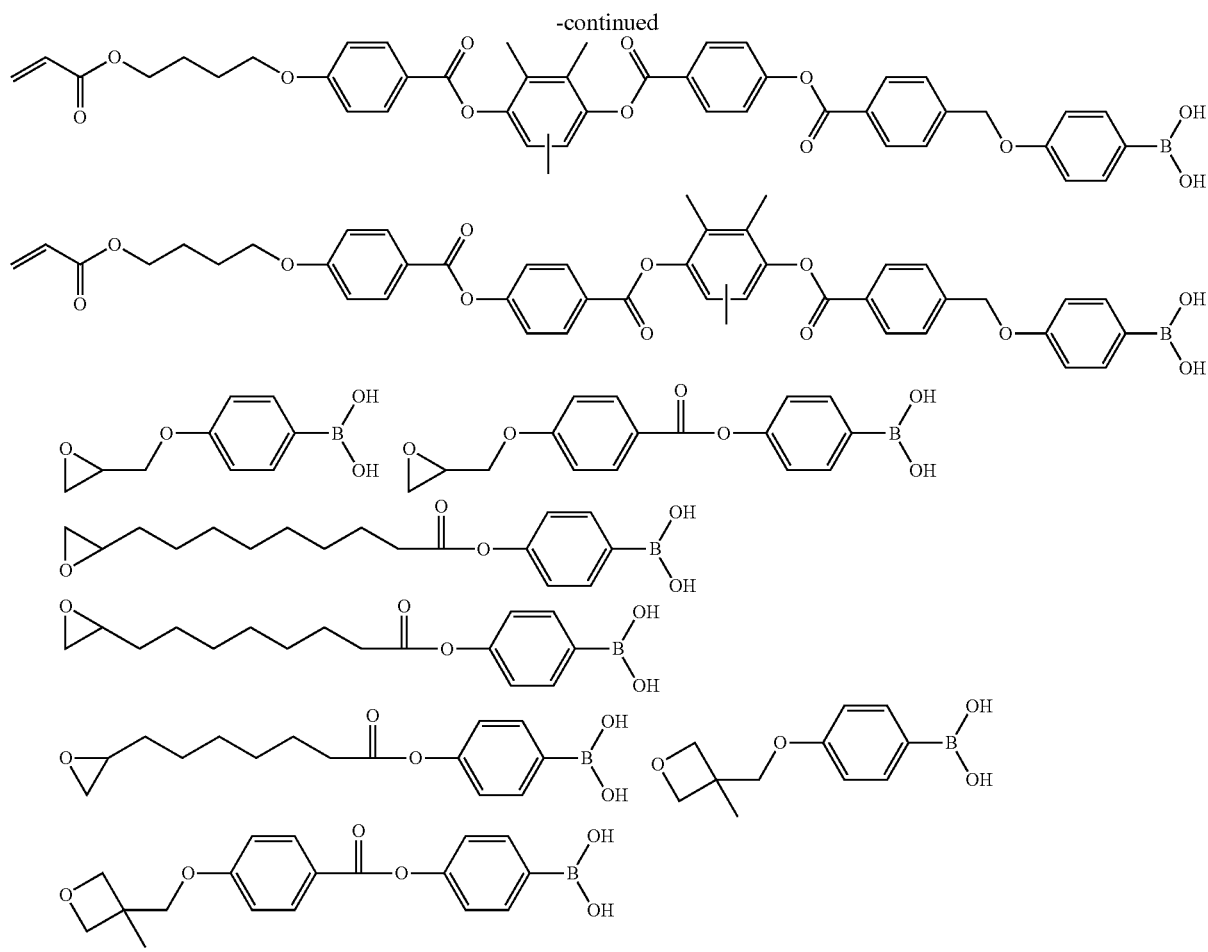

Furthermore, a boronic acid compound represented by General Formula II may be used.

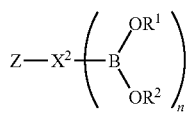

General Formula II

In General Formula II, Z, $R^1$, and $R^2$ each have the same definition as in General Formula I, and the preferred range thereof is also the same.

$X^2$ is an (n+1)-valent linking group obtained by further removing certain (n−1) hydrogen atoms from the divalent linking group represented by X described above. At this time, the preferred range of X is the same as that described above. $X^2$ is preferably an (n+1)-valent linking group obtained by further removing hydrogen atoms from either the linking group A or a divalent linking group constituted with a combination of two or more linking groups A. At this time, the linking group A is preferably an arylene group which may have a substituent or a heteroarylene group which may have a substituent, and more preferably a phenyl group or a divalent group formed by removing hydrogen atoms from pyrrole, furan, or thiophene.

n is an integer equal to or greater than 2. n is preferably 2 to 10, and more preferably 3.

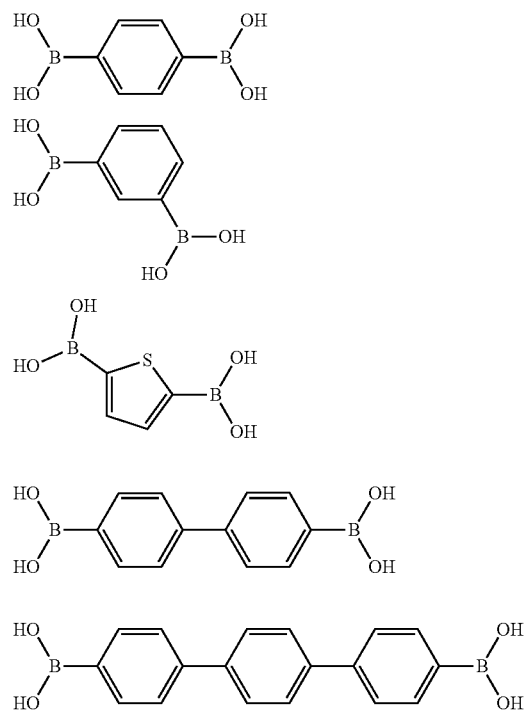

-continued

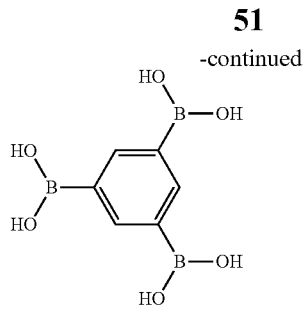

In the present specification, a compound, which is easily decomposed by being brought into contact with an inorganic substance or easily decomposed in a solvent and generates the aforementioned boronic acid compound, is also included in the boronic acid compound.

Examples of such a compound include a compound in which the hydrogen of one or two hydroxyl groups bonded to a boron in the boronic acid compound is substituted with a substituent other than a hydrogen atom, and a compound which has, instead of the boronic acid (—B(OH)$_2$) moiety of the boronic acid compound, a moiety having a structure that brings about the same effect as (—B(OH)$_2$) through equilibrium or adsorption in a case of contacting the inorganic substance. Specific examples of the compound which is easily decomposed and generates the boronic acid compound by being brought into contact with an inorganic substance include compounds having a partial structure represented by any of the following formulae. All of the partial structures represented by the following formulae may have a substituent in a substitutable moiety.

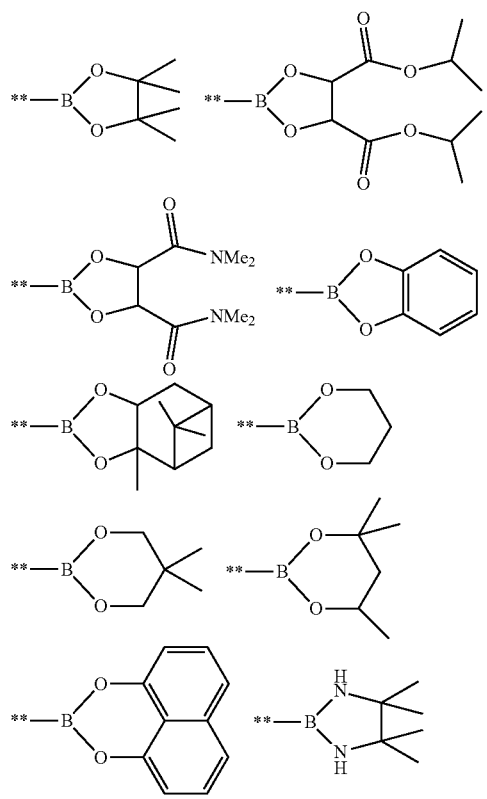

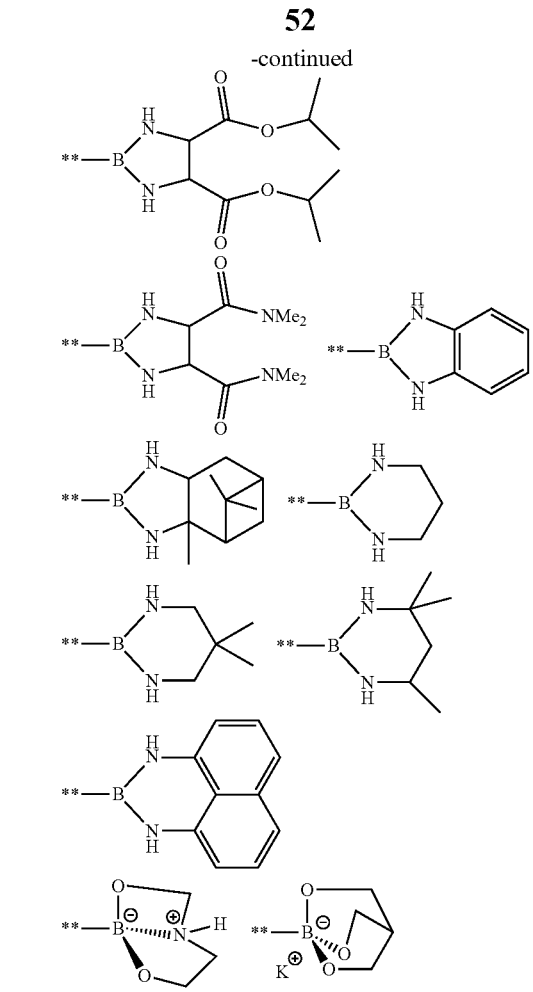

As the boronic acid compound, a boronic acid compound is also preferable which is easily decomposed by being brought into contact with an inorganic substance or easily decomposed in a solvent and generates the boronic acid compound represented by General Formula I or General Formula II described above. Examples of such a compound include the following ones.

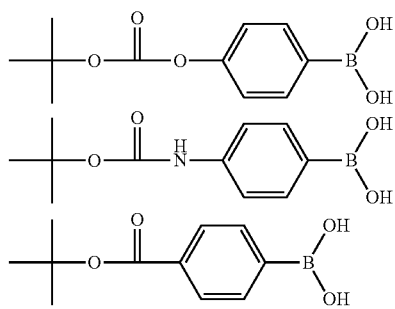

As the boronic acid compound, a commercial boronic acid compound may be used as it is. Alternatively, the boronic acid compound may be synthesized by using a boronic acid compound having a substituent as a raw material through a general synthesis reaction such as esterification, amidation, or alkylation. For example, the boronic acid compound can be synthesized from a halide (such as aryl bromide) by using n-butyl lithium and trialkoxyborane (such as trimethoxyborane) or synthesized by performing a Wittig reaction using metallic magnesium.

(Aldehyde Compound)

The aldehyde compound may modify the surface of an inorganic substance by reacting with the surface of the inorganic substance through the portion of an aldehyde group. The aldehyde compound may be a compound represented by General Formula VI, for example.

$$Z_Z-X_X-CHO \qquad \text{General Formula VI}$$

In the formula, $Z_Z$ represents a group selected from the group consisting of an amino group, a thiol group, a hydroxyl group, an isocyanate group, a carboxyl group, a carboxylic acid anhydride group, an oxetanyl group, an oxiranyl group, a (meth)acrylate group, and a hydrogen atom.

$X_X$ represents a divalent linking group. $X_X$ includes at least one linking group A selected from the group consisting of a divalent aliphatic hydrocarbon group which may have a substituent, an arylene group which may have a substituent, and a heteroarylene group which may have a substituent. $X_X$ may also include one or more linking groups B selected from the group consisting of —O—, —CO—, —NH—, —CO—NH—, —COO—, and —O—COO—. That is, $X_X$ is the linking group A, a linking group constituted with a combination of two or more linking groups A, or a linking group constituted with a combination of one or more linking groups A and one or more linking groups B.

The aforementioned divalent aliphatic hydrocarbon group which may have a substituent includes an alkylene group which may have a substituent and an alkenylene group which may have a substituent.

As $X_X$ in General Formula VI, a linking group containing a phenylene group which may have at least one substituent is preferable, and a linking group having a partial structure, in which two phenylene groups which may have a substituent are linked to each other through —COO—, is more preferable. Furthermore, as $X_X$, a linking group containing an unsubstituted phenylene group is preferable, and a linking group in which the unsubstituted phenylene group is directly bonded to a carbon atom derived from an aldehyde group is particularly preferable.

As $Z_Z$ in General Formula VI, an amino group, a thiol group, a hydroxyl group, an isocyanate group, a carboxyl group, and a carboxylic acid anhydride group are more preferable, and an amino group, a thiol group, and a hydroxyl group are even more preferable. Particularly, in a case where the resin composition contains a curing agent having a group selected from the group consisting of an amino group, a thiol group, a hydroxyl group, an isocyanate group, a carboxyl group, and a carboxylic acid anhydride group as a curing agent, it is also preferable that $Z_Z$ in General Formula VI is an oxiranyl group.

It is also preferable that the aldehyde compound has a chain-like structure, because then a monolayer is easily formed.

Preferred examples of the aldehyde compound represented by General Formula VI will be shown below, but the present invention is not limited thereto.

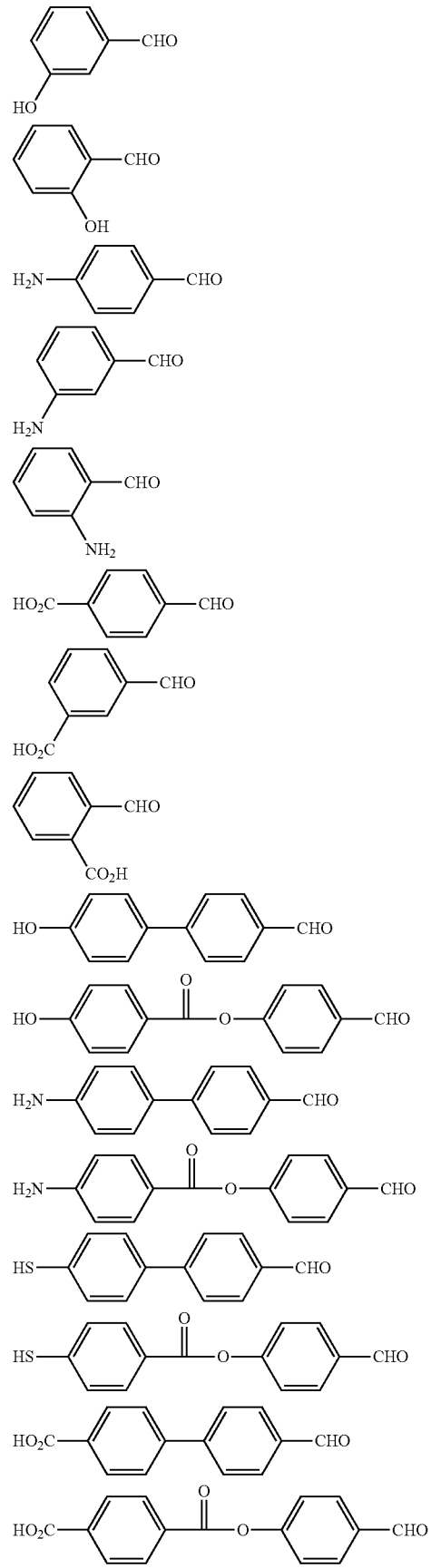

-continued

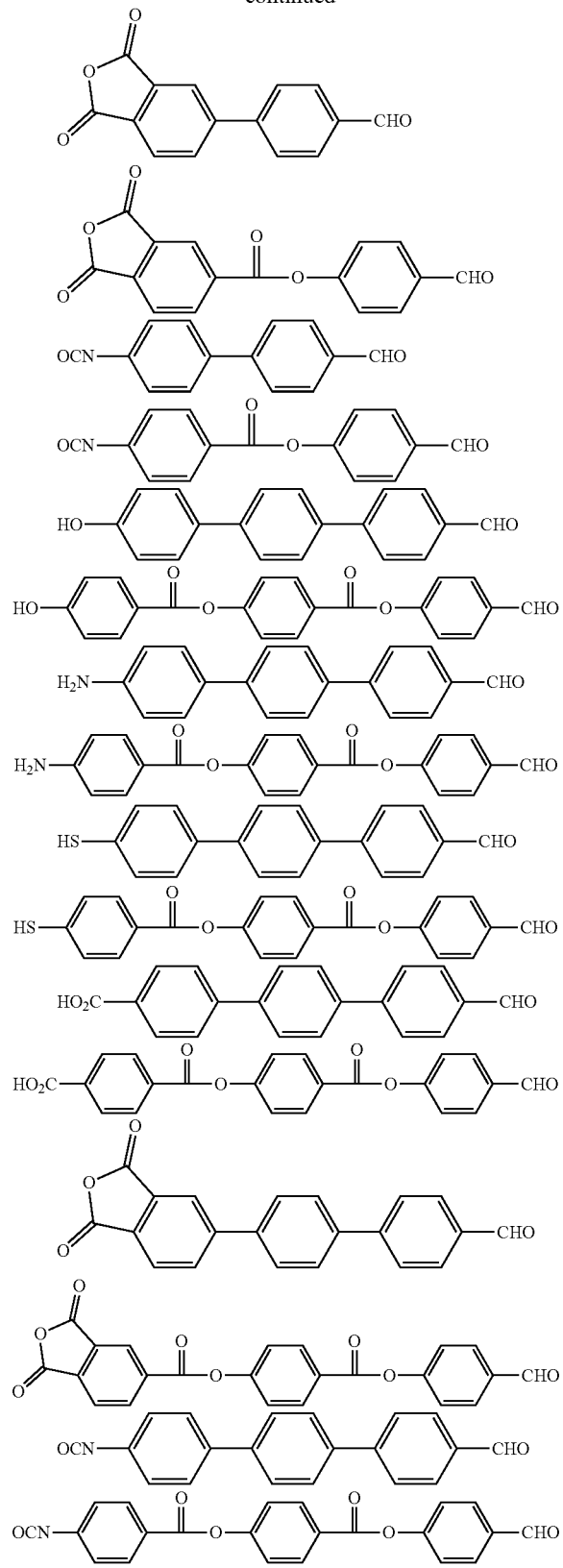

An aldehyde compound is also preferable which is easily decomposed by being brought into contact with an inorganic substance or easily decomposed in a solvent and generates the aldehyde compound represented by General Formula VI. Examples of such a compound include the following ones.

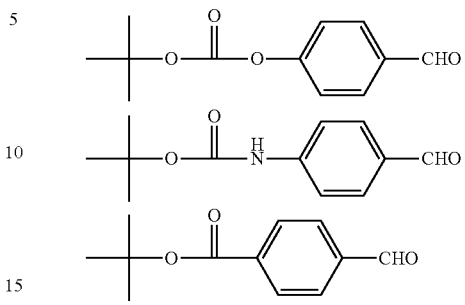

As the aldehyde compound, a commercial aldehyde compound may be used as it is. Alternatively, the aldehyde compound may be synthesized.

An aromatic aldehyde can be synthesized through the Vilsmeier reaction of the corresponding compound. Furthermore, an aliphatic aldehyde can be synthesized by an oxidation reaction of the corresponding compound.

<Surface-Modified Inorganic Substance>

As described above, the composition containing a disk-like compound may contain an inorganic substance as a surface-modified inorganic substance.

In the surface-modified inorganic substance, a surface modifier modifies the surface of an inorganic substance which is an inorganic nitride or an inorganic oxide. It is preferable that the surface modifier modifies the surface by performing a chemical reaction with the inorganic substance.

The shape of the surface-modified inorganic substance is not particularly limited, and may be granular, film-like, or plate-like. The granular surface-modified inorganic substance may be made into finer granules by using a treatment such as dispersion. Furthermore, the surface-modified inorganic substance may have the shape of a nanosheet, a nanotube, a nanorod, or the like.

The surface-modified inorganic substance can be manufactured by allowing an inorganic substance to form a chemical bond by performing an acid-base reaction with an acid such as a carboxylic acid, or by a chemical bond with a surface modifier formed by exploiting a silane coupling reaction or the like. Regarding the surface modification of the aforementioned inorganic granules, "Effect of silane coupling agent and how to use it (Science & Technology Co., Ltd., Yoshinobu Nakamura) can be referred to.

For example, in a case where the surface modifier is a boronic acid compound, typically, the boronic acid compound may react with a —$NH_2$ group or a OH group on the surface of an inorganic substance and form a bond represented by —NH—B— or a bond represented by O—B—. For example, in a case where the compound represented by General Formula I is used as the boronic acid compound, organic chains represented by Z—X— can exist on the surface of the inorganic substance through the aforementioned bond. The organic chains may then form a monolayer preferably in an arrayed state.

In a case where a boronic acid compound or an aldehyde compound is used as a surface modifier, the surface-modified inorganic substance can be easily manufactured by making a contact between an inorganic substance and the boronic acid compound or the aldehyde compound. The contact between the inorganic substance and the boronic acid compound or the aldehyde compound can be established by, for example, stirring a solution containing an inorganic nitride or an inorganic oxide and the boronic acid compound or the aldehyde compound. Particularly, in a case where the inorganic nitride or the inorganic oxide is granular, it is preferable to make the contact by stirring.

A solvent of the aforementioned solution is not particularly limited, but is preferably an organic solvent. Examples of the organic solvent include ethyl acetate, methyl ethyl ketone, dichloromethane, tetrahydrofuran (THF), and the like.

The aforementioned solution may contain other components in the composition containing a disk-like compound.

A mixing ratio between the inorganic substance and the surface modifier may be determined in consideration of the structure such as the structure and the surface area of the inorganic substance, the aspect ratio of the molecule of the surface modifier, and the like.

The stirring conditions are not particularly limited. For example, stirring may be performed at room temperature or may be performed for about 1 to 10 seconds at a stirring rotation speed of about 50 rpm.

<Solvent>

The composition containing a disk-like compound may be prepared as a solution.

The solvent of the aforementioned solution is not particularly limited, but is preferably an organic solvent. Examples of the organic solvent include ethyl acetate, methyl ethyl ketone (MEK), dichloromethane, tetrahydrofuran (THF), and the like.

<Cured Substance>

In the first aspect of the present invention, the thermally conductive material contains a cured substance of the resin composition containing a disk-like compound. In this aspect, it is preferable that the disk-like compound has a functional group. The cured substance can be prepared by a curing reaction of the resin composition. The curing may be a thermal curing reaction or a photocuring reaction, and the curing reaction may be selected according to the functional group of the monomer in the resin composition. Generally, a thermal curing reaction is preferable as curing. The heating temperature at the time of the curing is not particularly limited. For example, the heating temperature may be appropriately selected within a range of 50° C. to 200° C. and preferably within a range of 60° C. to 150° C.

It is preferable that the curing is performed on the resin composition formed into a film or sheet. Specifically, the resin composition may be formed into a film by coating and subjected to a curing reaction. At this time, press working may also be performed.

The curing may be semi-curing. Furthermore, the thermally conductive material of the present invention may be disposed in a device to be used or the like by being brought into contact with the device, and then permanently cured by being further cured through heating or the like. It is also preferable to allow the device and the thermally conductive material of the present invention to stick to each other through the heating or the like that is performed for the permanent curing described above.

Regarding the preparation of the thermally conductive material including the curing reaction, "Highly Thermally Conductive Composite Material" (CMC Publishing CO., LTD., Yoshitaka Takezawa) pp. 63-78 can be referred to.

<Uncured Substance>

In the second aspect of the present invention, the thermally conductive material contains a composition which contains a disk-like compound and is uncured. Even in a case where the disk-like compound is not a polymer, the disk-like compound exhibits relatively high thermal conductivity. The uncured composition is more easily disposed in a device to be used or the like by being brought into contact with the device, and can be used as an adhesive.

In this aspect, the disk-like compound may not have a functional group. For example, it is possible to use a compound represented by any of General Formulae D1 to D16 in which all Q's represent a hydrogen atom, a halogen atom, or a cyano group.

<Support or the Like>

The thermally conductive material may include other members in addition to the member formed of the composition containing a disk-like compound.

For example, the sheet-like thermally conductive material may include a sheet-like support in addition to a layer formed of the composition containing a disk-like compound.

Examples of the sheet-like support include a plastic film, a metal film, and a glass plate. Examples of materials of the plastic film include polyester such as polyethylene terephthalate (PET), polycarbonate, an acryl resin, an epoxy resin, polyurethane, polyamide, polyolefin, a cellulose derivative, silicone, and the like. Examples of the metal film include a copper film.

<Use of Thermally Conductive Material>

The thermally conductive material can be used as a heat dissipation material such as a heat dissipation sheet and used for dissipating heat from various devices.

The thermally conductive material of the present invention (particularly the thermally conductive material of the first aspect) has sufficient thermal conductivity and high heat resistance. Accordingly, the thermally conductive material is appropriate for dissipating heat from power semiconductor devices used in various electric apparatuses such as personal computers, general home appliances, and automobiles.

Furthermore, in the thermally conductive material of the present invention, the composition containing a disk-like compound is used. Therefore, the thermally conductive material has sufficient thermal conductivity even in a state of an uncured or semi-cured substance. Accordingly, the thermally conductive material can be used as a heat dissipation material disposed in portions to which light for photocuring does not easily reach, such as voids in members of various apparatuses. In addition, the thermally conductive material can also be used as an adhesive having thermal conductivity.

EXAMPLES

Hereinafter, the present invention will be more specifically described based on examples. The materials and reagents, the amounts of substances and a ratio therebetween, the operation, and the like described in the following examples can be appropriately changed within a range that does not depart from the gist of the present invention. Accordingly, the scope of the present invention is not limited to the following examples.

Preparation of Thermally Conductive Materials of Examples 1 to 28 and Comparative Examples 1 and 2

By mixing the materials in Table 1 together, a slurry was prepared. A 2.0 cm×2.5 cm PET film (COSMOSHINE, manufactured by Toyobo Co., Ltd., film thickness: 50 μm) was coated with 1 mL of the slurry by using a spin coater, thereby preparing a film having a uniform surface shape. The film was disposed on a hot plate, and the solvent was stepwise evaporated for 30 seconds at 60° C., 30 seconds at 80° C., and 30 seconds at 100° C. Thereafter, the film was heated for 30 seconds at 160° C., then cooled to room temperature, and peeled from the PET film, thereby obtaining a thermally conductive material in the form of a self-supported film having a thickness of about 400 μm.

The materials in Table 1 were prepared as below.
[Main Agent]
(Disk-Like Liquid Crystal Compound 1)

According to the method described on page 1190 in the December issue (2002) of The Journal of The Society of Synthetic Organic Chemistry, a compound THABB was synthesized and used as a disk-like liquid crystal compound 1.

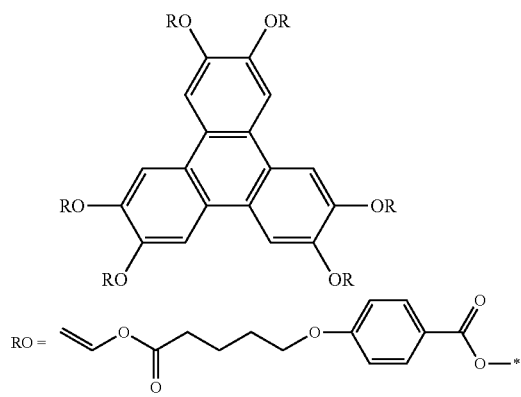

(Disk-Like Liquid Crystal Compound 2)
According to the method described in examples in JP2696480B, a compound TP-85 was synthesized and used as a disk-like liquid crystal compound 2.

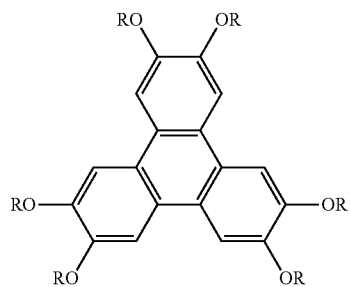

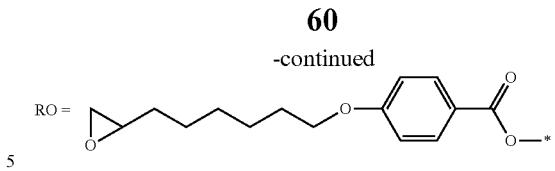

(Disk-Like Liquid Crystal Compound 3)
According to the method described in Example 13 in JP5385937B, a compound D-227 was synthesized and used as a disk-like liquid crystal compound 3.

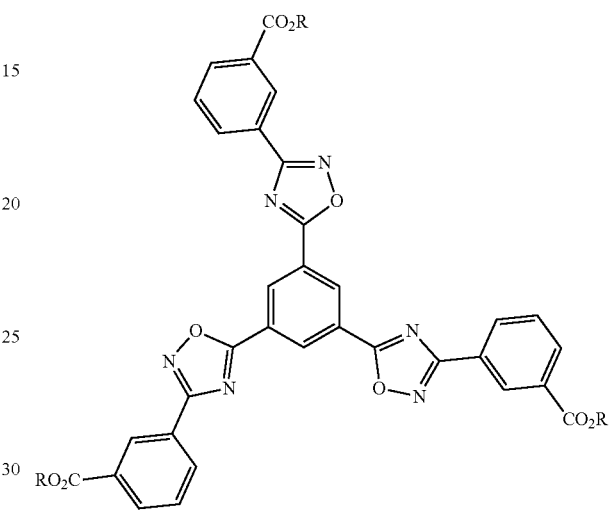

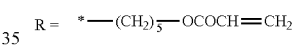

(Disk-Like Liquid Crystal Compound 4)
According to the method described in examples in JP5385937B, a trihydroxy substance shown below was synthesized. The substance was alkylated based on the method described in examples in JP2696480B and then oxidized using mCPBA, thereby obtaining a disk-like liquid crystal compound 4 shown below.

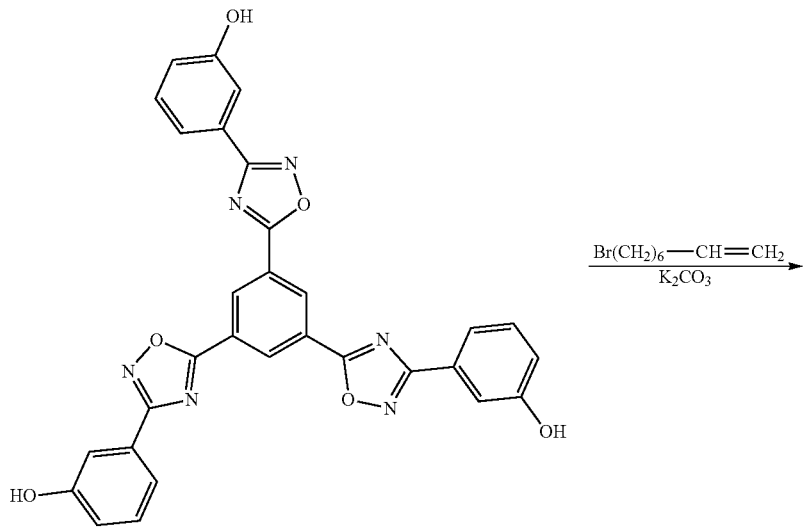

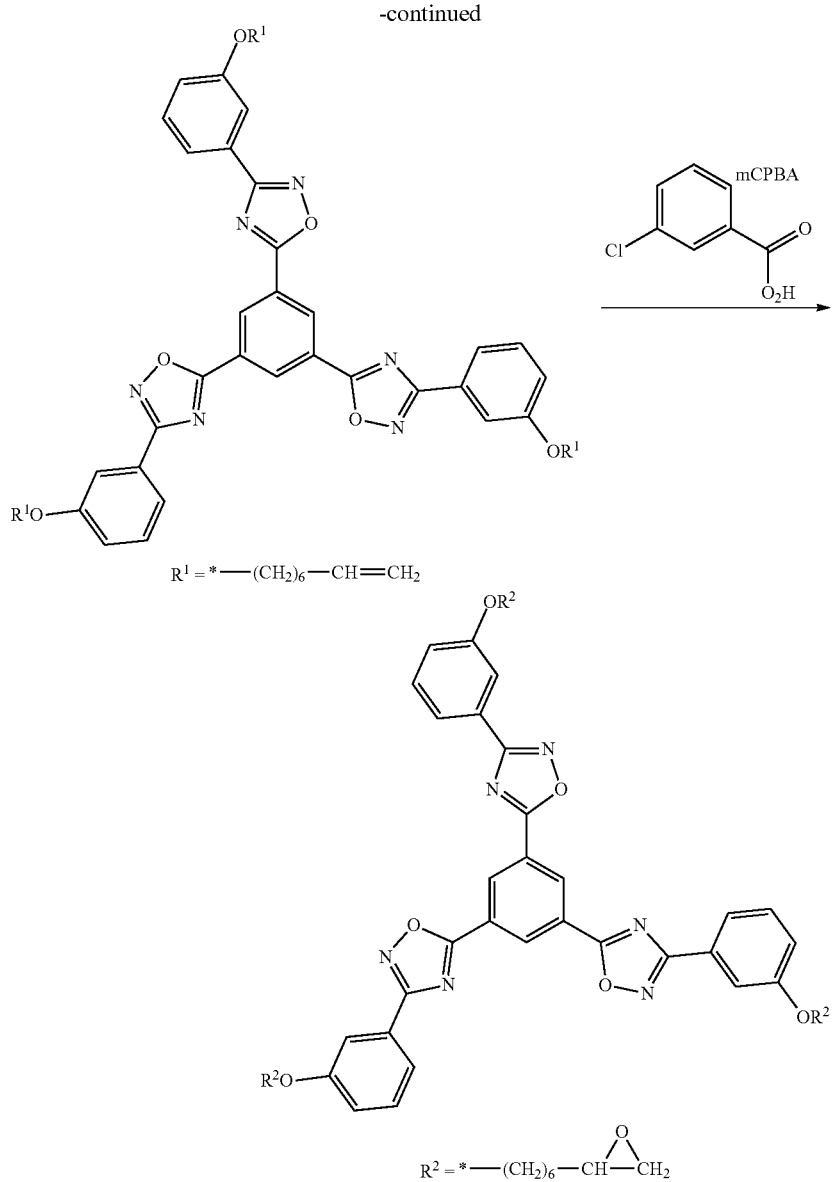

(Disk-Like Liquid Crystal Compound 5)

According to the method in Example 14 described in JP5620129B, an example compound 13 was synthesized and used as a disk-like liquid crystal compound 5.

(Disk-Like Liquid Crystal Compound 6)

According to the method described in Example 13 in JP5620129B, an intermediate shown below was synthesized. Then, the intermediate was reacted with epichlorohydrin, thereby synthesizing a disk-like liquid crystal compound 6.

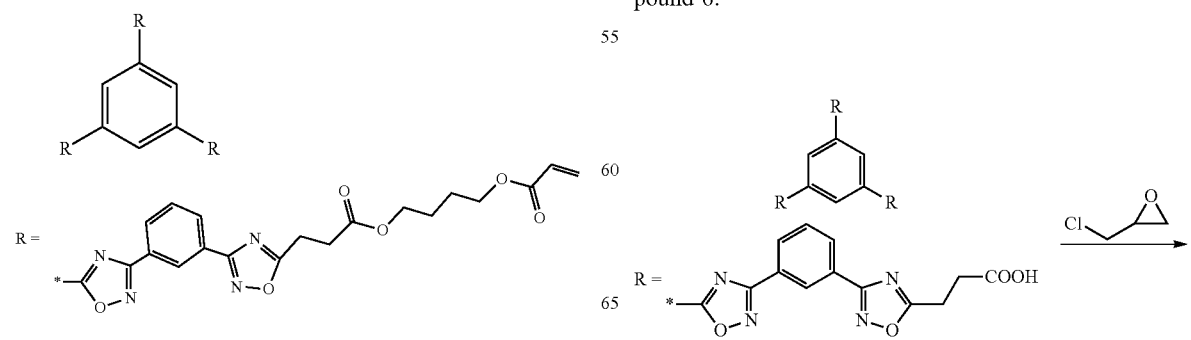

-continued

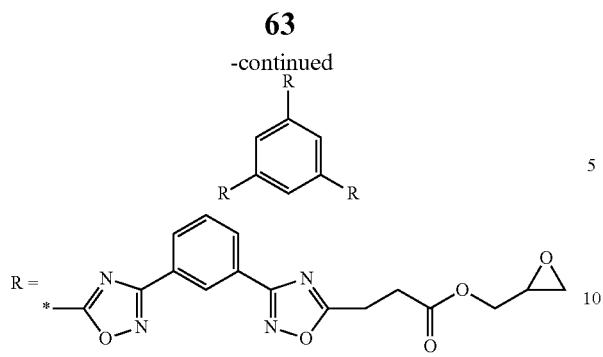

(Rod-Like Liquid Crystal Compound)

Rod-like liquid crystal compound 1: the following rod-like liquid crystal compound described in Die Makromolekular Chemie, 192, p. 59 (1991) was synthesized.

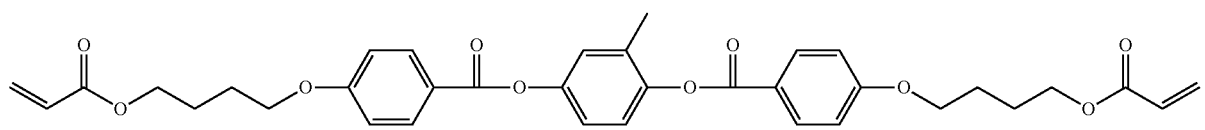 [SMILES: C=CC(=O)OCCCCOc1ccc(C(=O)Oc2ccc(OC(=O)c3ccc(OCCCCOC(=O)C=C)cc3)c(C)c2)cc1]

(Rod-Like Compound 1)

4,4'-isopropylidenediphenol dimethacrylate (manufactured by Wako Pure Chemical Industries, Ltd.) was used.

[Curing Agent and Polymerization Initiator]

Curing agent 1: 1,5-naphthalenediamine (manufactured by TOKYO CHEMICAL INDUSTRY CO., LTD.)

Curing agent 2: 4,4'-diaminodiphenylmethane (manufactured by TOKYO CHEMICAL INDUSTRY CO., LTD.)

Curing agent 3: 4,4'-diaminodiphenylsulfone (manufactured by TOKYO CHEMICAL INDUSTRY CO., LTD.)

Thermal polymerization initiator (initiator 1): 2,2'-azobis(N-butyl-2-methylpropionamide (VAm-110, manufactured by Wako Pure Chemical Industries, Ltd.)

[Inorganic Substance]

Boron nitride 1 (hereinafter, described as BN1): BORONID Cooling Filer AGGLOMERATE 50 (manufactured by 3M)

Boron nitride 2 (hereinafter, described as BN2): BORONID Cooling Filer AGGLOMERATE 100 (manufactured by 3M)

Boron nitride 3 (hereinafter, described as BN3): DENKA BORON NITRIDE FP70 (manufactured by Denka Company Limited.)

Alumina: AW70 (manufactured by Micron Co., Ltd.)

[Surface Modifier]

Silane coupling agent: 3-aminopropyltrimethoxysilane KBM-903 (manufactured by Shin-Etsu Chemical Co., Ltd.)

Boronic acid 1: p-hydroxyphenyl boronic acid (manufactured by Wako Pure Chemical Industries, Ltd.)

Boronic acid 2: m-aminophenyl boronic acid (manufactured by Wako Pure Chemical Industries, Ltd.)

Aldehyde 1: 4-hydroxybenzaldehyde (manufactured by Sigma-Aldrich Co. LLC.)

Evaluation of Thermally Conductive Materials of Examples 1 to 28 and Comparative Examples 1 and 2

[Measurement of Coefficient of Linear Expansion]

By using a thermal stress strain measuring apparatus TMA/SS120U manufactured by Seiko Instruments Inc., a coefficient of linear expansion was measured at a temperature within a range of 30° C. to 270° C. The heating rate was set to be 5° C./min. From the slope of a straight line linking two points at 40° C. and 60° C., a coefficient of linear expansion was calculated. The results are shown in Table 1.

[Measurement of Glass Transition Temperature]

By using a thermal stress strain measuring apparatus TMA/SS120U manufactured by Seiko Instruments Inc., a glass transition temperature was measured at a temperature within a range of 30° C. to 270° C. The heating rate was set to be 5° C./min. The temperature at which a coefficient of linear expansion changed was taken as a glass transition temperature. In a case where Tg was equal to or lower than room temperature, the glass transition temperature was described as "<25".

The results are shown in Table 1.

[Measurement of Thermal Conductivity]

(1) By using "ai-Phase Mobile 1u" manufactured by ai-Phase Co., Ltd., a coefficient of thermal diffusivity in a thickness direction was measured.

(2) By using a balance "XS204" ("solid specific gravity measuring kit" is used) manufactured by METTLER TOLEDO, the specific gravity was measured.

(3) By using "DSC320/6200" manufactured by Seiko Instruments Inc. and software of DSC7, the specific heat at 25° C. was determined under the heating condition of 10° C./min.

(4) The obtained coefficient of thermal diffusivity was multiplied by the specific gravity and the specific heat, thereby calculating the thermal conductivity. The results are shown in Table 1.

TABLE 1

| | Main agent | g | Curing agent and initiator | g | Inorganic substance | g | Surface modifier | g | Solvent | g | Glass transition temperature (° C.) | Thermal conductivity (W/m · K) |
|---|---|---|---|---|---|---|---|---|---|---|---|---|
| Example 1 | Disk-like liquid crystal compound 1 | 5 | Initiator 1 | 0.05 | BN1 | 5 | N/A | 0 | MEK | 5 | 211 | 11.1 |
| Example 2 | Disk-like liquid crystal compound 1 | 5 | Initiator 1 | 0.05 | BN2 | 5 | N/A | 0 | MEK | 5 | 210 | 10.9 |
| Example 3 | Disk-like liquid crystal compound 1 | 5 | Initiator 1 | 0.05 | BN3 | 5 | N/A | 0 | MEK | 5 | 221 | 12.1 |
| Example 4 | Disk-like liquid crystal compound 1 | 5 | Initiator 1 | 0.05 | Alumina | 5 | Silane coupling agent | 0.05 | MEK | 5 | 212 | 5.3 |
| Example 5 | Disk-like liquid crystal compound 2 | 2.5 | Curing agent 1 | 2.5 | BN1 | 5 | N/A | 0 | MEK | 5 | 201 | 11.2 |
| Example 6 | Disk-like liquid crystal compound 2 | 2.5 | Curing agent 2 | 2.5 | BN1 | 5 | N/A | 0 | MEK | 5 | 194 | 11.5 |
| Example 7 | Disk-like liquid crystal compound 2 | 2.5 | Curing agent 3 | 2.5 | BN1 | 5 | N/A | 0 | MEK | 5 | 198 | 11.2 |
| Example 8 | Disk-like liquid crystal compound 2 | 2.5 | Curing agent 1 | 2.5 | BN1 | 5 | Boronic acid 1 | 0.05 | MEK | 5 | 197 | 13.4 |
| Example 9 | Disk-like liquid crystal compound 2 | 2.5 | Curing agent 1 | 2.5 | BN1 | 5 | Boronic acid 2 | 0.05 | MEK | 5 | 198 | 14.4 |
| Example 10 | Disk-like liquid crystal compound 2 | 2.5 | Curing agent 1 | 2.5 | BN1 | 5 | Aldehyde | 0.05 | MEK | 5 | 199 | 14.7 |
| Example 11 | Disk-like liquid crystal compound 3 | 5 | Initiator 1 | 0.05 | BN1 | 5 | N/A | 0 | MEK | 5 | 190 | 9.7 |
| Example 12 | Disk-like liquid crystal compound 3 | 5 | Initiator 1 | 0.05 | BN2 | 5 | N/A | 0 | MEK | 5 | 189 | 9.5 |
| Example 13 | Disk-like liquid crystal compound 3 | 5 | Initiator 1 | 0.05 | BN3 | 5 | N/A | 0 | MEK | 5 | 191 | 10 |
| Example 14 | Disk-like liquid crystal compound 4 | 2.5 | Curing agent 1 | 2.5 | BN1 | 5 | N/A | 0 | MEK | 5 | 183 | 10.1 |
| Example 15 | Disk-like liquid crystal compound 4 | 2.5 | Curing agent 2 | 2.5 | BN1 | 5 | N/A | 0 | MEK | 5 | 184 | 10.2 |
| Example 16 | Disk-like liquid crystal compound 4 | 2.5 | Curing agent 3 | 2.5 | BN1 | 5 | N/A | 0 | MEK | 5 | 188 | 10.1 |
| Example 17 | Disk-like liquid crystal compound 4 | 2.5 | Curing agent 1 | 2.5 | BN1 | 5 | Boronic acid 1 | 0.05 | MEK | 5 | 187 | 12.2 |
| Example 18 | Disk-like liquid crystal compound 4 | 2.5 | Curing agent 1 | 2.5 | BN1 | 5 | Boronic acid 2 | 0.05 | MEK | 5 | 186 | 12.1 |
| Example 19 | Disk-like liquid crystal compound 4 | 2.5 | Curing agent 1 | 2.5 | BN1 | 5 | Aldehyde | 0.05 | MEK | 5 | 186 | 13.1 |
| Example 20 | Disk-like liquid crystal compound 5 | 5 | Initiator 1 | 0.05 | BN1 | 5 | N/A | 0 | MEK | 5 | 187 | 11.1 |
| Example 21 | Disk-like liquid crystal compound 5 | 5 | Initiator 1 | 0.05 | BN2 | 5 | N/A | 0 | MEK | 5 | 186 | 11.3 |
| Example 22 | Disk-like liquid crystal compound 5 | 5 | Initiator 1 | 0.05 | BN3 | 5 | N/A | 0 | MEK | 5 | 183 | 11.1 |
| Example 23 | Disk-like liquid crystal compound 6 | 2.5 | Curing agent 1 | 2.5 | BN1 | 5 | N/A | 0 | MEK | 5 | 181 | 10.5 |
| Example 24 | Disk-like liquid crystal compound 6 | 2.5 | Curing agent 2 | 2.5 | BN1 | 5 | N/A | 0 | MEK | 5 | 184 | 11.2 |
| Example 25 | Disk-like liquid crystal compound 6 | 2.5 | Curing agent 3 | 2.5 | BN1 | 5 | N/A | 0 | MEK | 5 | 183 | 11.2 |
| Example 26 | Disk-like liquid crystal compound 6 | 2.5 | Curing agent 1 | 2.5 | BN1 | 5 | Boronic acid 1 | 0.05 | MEK | 5 | 182 | 12.4 |
| Example 27 | Disk-like liquid crystal compound 6 | 2.5 | Curing agent 1 | 2.5 | BN1 | 5 | Boronic acid 2 | 0.05 | MEK | 5 | 183 | 13.2 |
| Example 28 | Disk-like liquid crystal compound 6 | 2.5 | Curing agent 1 | 2.5 | BN1 | 5 | Aldehyde | 0.05 | MEK | 5 | 183 | 12.9 |
| Comparative Example 1 | Rod-like liquid crystal compound 1 | 5 | Initiator 1 | 0.05 | BN1 | 5 | N/A | 0 | MEK | 5 | 170 | 7.3 |
| Comparative Example 2 | Rod-like compound 1 | 5 | Initiator 1 | 0.05 | BN1 | 5 | N/A | 0 | MEK | 5 | 130 | 5.3 |

From the results shown in Table 1, it is understood that in the examples including the cured substance of the resin composition containing a disk-like compound, the obtained thermal conductivity and heat resistance are higher than those in the examples including the cured substance of the resin composition containing a rod-like compound.

Examples 31 to 34 and Comparative Examples 31 and 32 (Examples in Which an Inorganic Substance was not Used)

By using the disk-like liquid crystal compound 1, the disk-like liquid crystal compound 5, the rod-like liquid crystal compound 1, the rod-like compound 1, the polymerization initiator 1, and the curing agent 2 described above and using a disk-like compound 7 and a disk-like compound 8 shown below, in the manner described below, thermally conductive materials of Examples 31 to 34 and Comparative Examples 31 and 32 were prepared as thermally conductive materials in which an inorganic substance was not used. The thermal conductivity of each of the cured films in the obtained thermally conductive materials was measured by the same method as that used for measuring the thermal conductivity of the thermally conductive material of Example 1 described above. The results are shown in Table 2.

Example 31

The disk-like liquid crystal compound 1 (10.0 g), a trifunctional monomer (manufactured by OSAKA ORGANIC CHEMICAL INDUSTRY LTD, VISCOAT #360, TMPTEOA, 0.50 g), and a photopolymerization initiator 1 (0.1 g) were dissolved in 10 g of methyl ethyl ketone (MEK), thereby preparing a coating solution. A glass substrate, which was treated with dimethyldichlorosiloxane so as to become hydrophobic and had a thickness of 1 mm, was coated with the obtained coating solution such that the thickness thereof became 600 μm. The coating film was dried at room temperature and then irradiated with light at 1,000 mJ and 90° C. The film was cooled to room temperature and peeled from the glass substrate, thereby obtaining a cured film A.

Example 32

The disk-like liquid crystal compound 5 (10.0 g) and the photopolymerization initiator 1 (0.1 g) were dissolved in 10 g of MEK, thereby preparing a coating solution. A glass substrate, which was treated with dimethyldichlorosiloxane so as to become hydrophobic and had a thickness of 1 mm, was coated with the obtained coating solution such that the thickness thereof became 600 μm. The coating film was dried at room temperature and then irradiated with light at 1,000 mJ and 90° C. The film was cooled to room temperature and peeled from the glass substrate, thereby obtaining a cured film B.

Example 33

(Preparation of Disk-Like Compound 7)

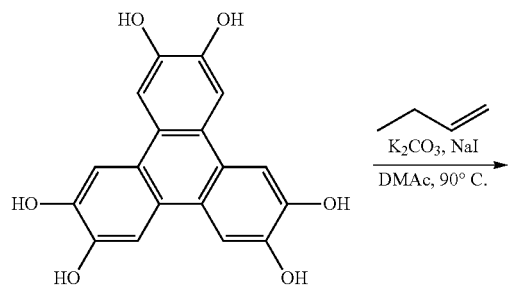

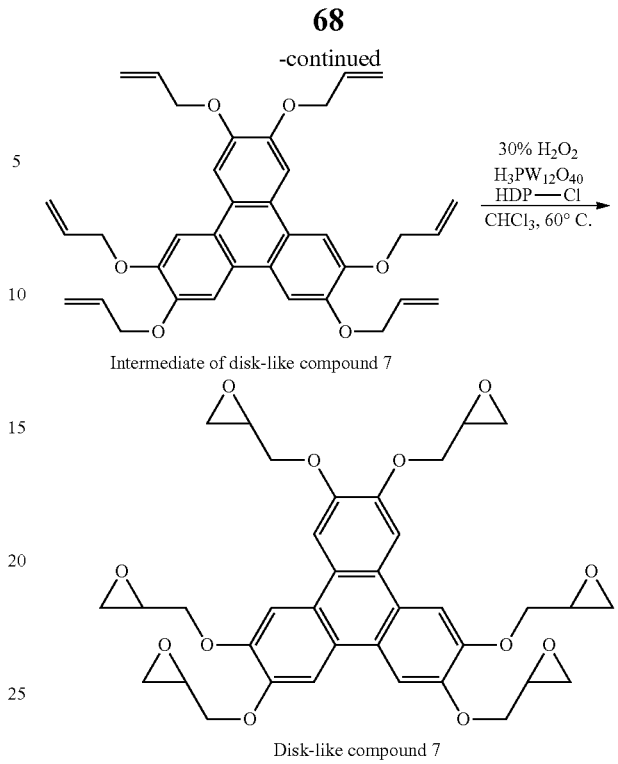

30 g of 2,3,6,7,10,11-hexahydroxytriphenylene (TP-B), 100.7 g of allyl bromide, 84.4 g of potassium carbonate, 1.39 g of sodium iodide, and 200 mL of N,N-dimethylacetamide were put into a 1 L three-neck flask, and stirred for 5 hours at 90° C. After cooling, 300 mL of distilled water was added to the reaction mixture, and extraction was performed using 500 mL of ethyl acetate. The resultant was washed twice with 300 mL of distilled water and then dried over anhydrous magnesium sulfate. The solvent was concentrated under reduced pressure, and then the resultant was added to a mixed solvent of 50 mL of ethyl acetate/200 mL of methanol and dissolved by heating. After cooling, the generated crystals were filtered under reduced pressure. The resultant was dried at 50° C. under reduced pressure, and then 41.2 g of an intermediate of the disk-like compound 7 was obtained (82%).

200 mL of chloroform was poured into a 1 L three-neck flask containing 20.9 g of phosphotungstic acid and 3.7 g of hexadecylpyridinium chloride, and then 55.7 g of 30% aqueous hydrogen peroxide was poured into the flask. The mixture was stirred for 10 minutes, 10 g of the intermediate of the disk-like compound 7 was then added thereto, and the mixture was stirred for 4 hours at 60° C. After cooling, the reaction mixture was washed with a saturated aqueous solution of sodium sulfite and saturated saline. The resultant was dried over anhydrous magnesium sulfate and then concentrated under reduced pressure. The resultant was purified by silica gel chromatography, thereby obtaining the disk-like compound 7 (3.6 g, yield: 30%).

(Preparation of Thermally Conductive Material)

The disk-like compound 7 (10 g) and the curing agent 2 (4,4'-diaminodiphenylmethane, 5 g) were dissolved in 10 g of MEK, thereby obtaining a coating solution. A PET film was coated with the coating solution such that the thickness thereof became 600 μm, and the coating solution was dried at room temperature and then cured under the condition of 160° C. and 10 minutes. The cured film was cooled to room temperature and peeled from the PET film, thereby obtaining a cured film C.

Example 34

(Preparation of Disk-Like Compound 8)

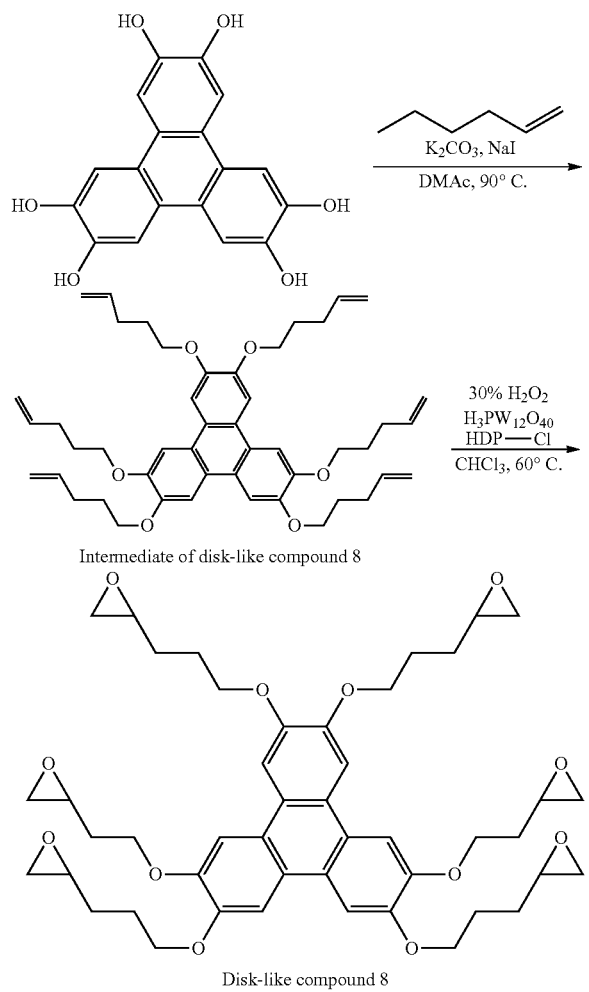

30 g of 2,3,6,7,10,11-hexahydroxytriphenylene (TP-B), 124.1 g of 5-bromo-1-pentene, 84.4 g of potassium carbonate, 1.39 g of sodium iodide, and 300 mL of N,N-dimethylacetamide were put into a 1 L three-neck flask, and stirred for 5 hours at 90° C. After cooling, 300 mL of distilled water was added to the reaction mixture, and extraction was performed using 500 mL of ethyl acetate. The resultant was washed twice with 300 mL of distilled water and then dried over anhydrous magnesium sulfate. The solvent was concentrated under reduced pressure, and then the resultant was added to a mixed solvent of 120 mL of ethyl acetate/400 mL of methanol and dissolved by heating. After cooling, the generated crystals were filtered under reduced pressure. The resultant was dried at 50° C. under reduced pressure, and then 57.5 g of an intermediate of the disk-like compound 8 was obtained (85%).

200 mL of chloroform was poured into a 1 L three-neck flask containing 55.7 g of phosphotungstic acid and 2.8 g of hexadecylpyridinium chloride, and then 55.7 g of 30% aqueous hydrogen peroxide was poured into the flask. The mixture was stirred for 10 minutes, 10 g of the intermediate of the disk-like compound 8 was then added thereto, and the mixture was stirred for 7 hours at 60° C. After cooling, the mixture was washed with a saturated aqueous solution of sodium sulfite and saturated saline. The resultant was dried over anhydrous magnesium sulfate and then concentrated under reduced pressure. The resultant was purified by silica gel chromatography, thereby obtaining the disk-like compound 8 (3.6 g, yield: 32%).

(Preparation of Thermally Conductive Material)

The disk-like compound 8 (10 g) and the curing agent 2 (4,4'-diaminodiphenylmethane, 5 g) were dissolved in 10 g of MEK, thereby obtaining a coating solution. A PET film was coated with the coating solution such that the thickness thereof became 600 μm, and the coating solution was dried at room temperature and then cured under the condition of 160° C. and 10 minutes. The cured film was cooled to room temperature and peeled from the PET film, thereby obtaining a cured film D.

Comparative Example 31

The rod-like liquid crystal compound 1 (10.0 g) and the photopolymerization initiator 1 (0.1 g) were dissolved in 10 g of MEK, thereby obtaining a coating solution. A glass substrate, which was treated with dimethyldichlorosiloxane so as to become hydrophobic and had a thickness of 1 mm, was coated with the coating solution such that the thickness thereof became 600 μm. The coating film was dried at room temperature and then irradiated with light at 1,000 mJ and 90° C. The coating film was cooled to room temperature and peeled from the glass substrate, thereby obtaining a cured film F.

Comparative Example 32

The rod-like compound 1 (10.0 g) and a photopolymerization initiator (Irg-907, manufactured by BASF SE, 0.1 g) were dissolved in 10 g of MEK, thereby obtaining a coating solution. A glass substrate, which was treated with dimethyldichlorosiloxane so as to become hydrophobic and had a thickness of 1 mm, was coated with the coating solution such that the thickness thereof became 600 μm. The coating film was dried at room temperature and then irradiated with light at 1,000 mJ and 90° C. The coating film was cooled to room temperature and peeled from the glass substrate, thereby obtaining a cured film G.

TABLE 2

| | Used compound | Curing agent | Thermal conductivity [W/m · K] |
|---|---|---|---|
| Example 31 | Disk-like liquid crystal compound 1 | Photopolymerization initiator 1 | 1.74 |
| Example 32 | Disk-like liquid crystal compound 5 | Photopolymerization initiator 1 | 0.30 |
| Example 33 | Disk-like compound 7 | Curing agent 2 | 3.41 |
| Example 34 | Disk-like compound 8 | Curing agent 2 | 2.27 |
| Comparative Example 31 | Rod-like liquid crystal compound 1 | Photopolymerization initiator 1 | 0.22 |
| Comparative Example 32 | Rod-like compound 1 | Photopolymerization initiator 1 | 0.11 |

From Table 2, it is understood that the disk-like compound exhibits thermal conductivity higher than that of the rod-like compound. Furthermore, it is understood that even though the thermally conductive material was formed using a resin composition which does not contain an inorganic substance, the thermally conductive material exhibits high thermal conductivity.

Examples 41 to 43 and Comparative Examples 41 and 42 (Examples of an Uncured Substance (in Which an Inorganic Substance was not Used))

By using the coating films (coating films A, B, F, and G not yet being cured), which were not yet being cured, of Examples 31 and 32 and Comparative Examples 31 and 32 and a disk-like liquid crystal compound 9 which did not have a functional group (polymerizable group), a coating film E was prepared as below. The thermal conductivity of the coating film E was measured by the same method as that used for measuring the thermal conductivity of the thermally conductive material of Example 1 described above. The results are shown in Table 3.

Example 43

(Preparation of Disk-Like Liquid Crystal Compound 9)
According to the method described in Polymer for Advanced Technologies, 111, 398-403, (2000), the disk-like liquid crystal compound 9 was synthesized.

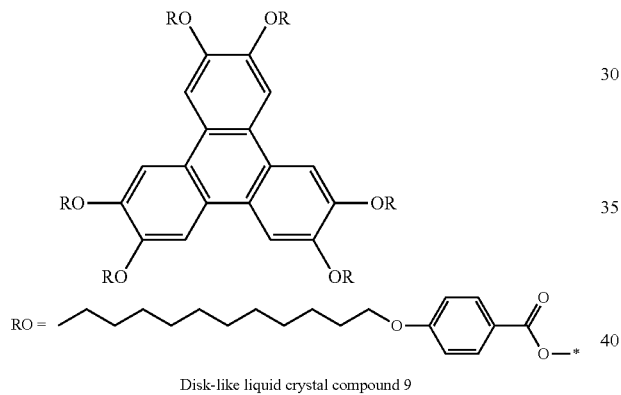

Disk-like liquid crystal compound 9

(Preparation of Thermally Conductive Material)
The disk-like compound 9 (10 g) was dissolved in 10 g of MEK, thereby obtaining a coating solution. A PET film was coated with the coating solution such that the thickness thereof became 600 μm. The coating solution was dried at room temperature, then left to stand at 160° C. for 10 minutes, and then returned to room temperature, thereby preparing a coating film E.

TABLE 3

|  | Used compound | Curing agent | Thermal conductivity [W/m · K] |
|---|---|---|---|
| Example 41 | Disk-like liquid crystal compound 1 | N/A | 0.89 |
| Example 42 | Disk-like liquid crystal compound 5 | N/A | 0.26 |
| Example 43 | Disk-like liquid crystal compound 9 | N/A | 0.77 |
| Comparative Example 41 | Rod-like liquid crystal compound 1 | N/A | 0.11 |
| Comparative Example 42 | Rod-like compound 1 | N/A | 0.08 |

From Table 3, it is understood that the disk-like compound exhibits relatively high thermal conductivity even in a non-polymerized state.

What is claimed is:

1. A thermally conductive material comprising:
a disk-like compound, and
an inorganic substance, wherein the inorganic substance comprises boron nitride,
the disk-like compound is either a compound obtained by a reaction of one or more compounds selected from the group consisting of compounds represented by any of General Formulae D1 to D16 at Q or one or more compounds selected from the group consisting of compounds represented by any of General Formulae D1 to D16,

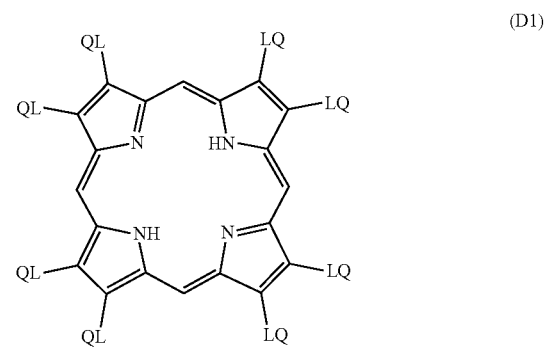

(D1)

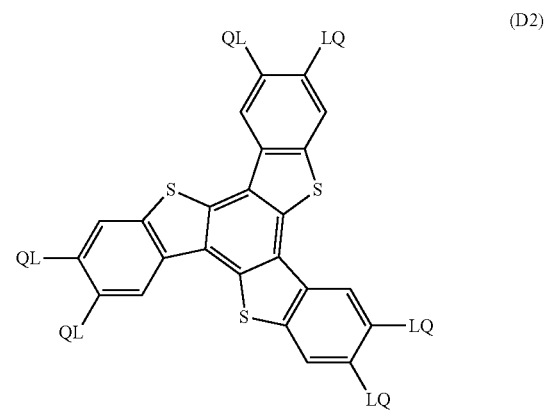

(D2)

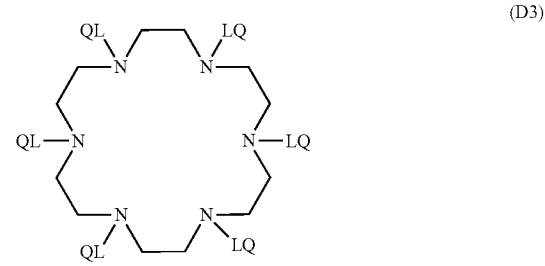

(D3)

73
-continued
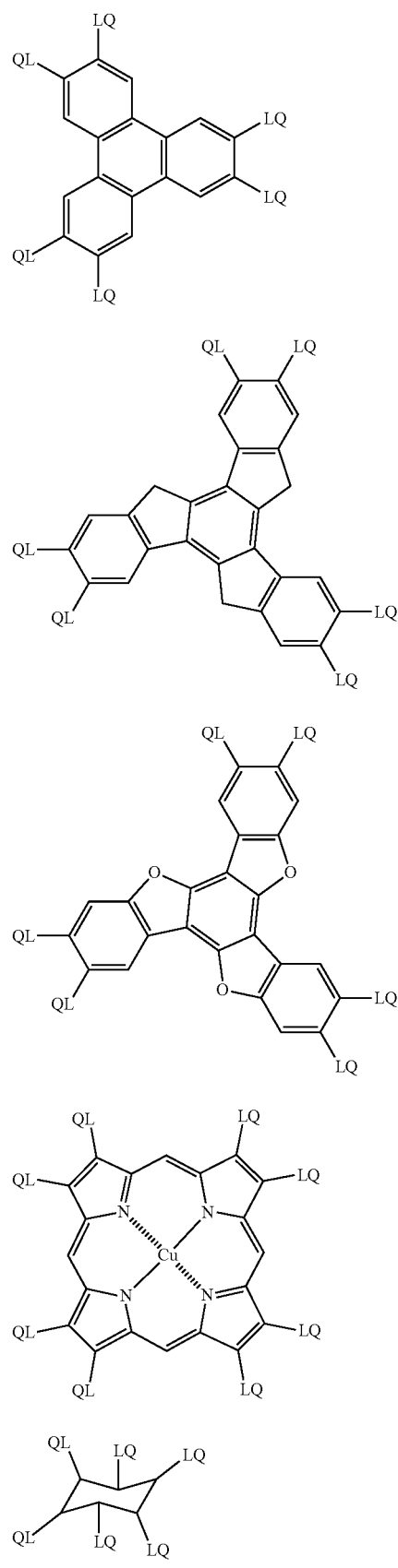
(D4)
(D5)
(D6)
(D7)
(D8)
74
-continued
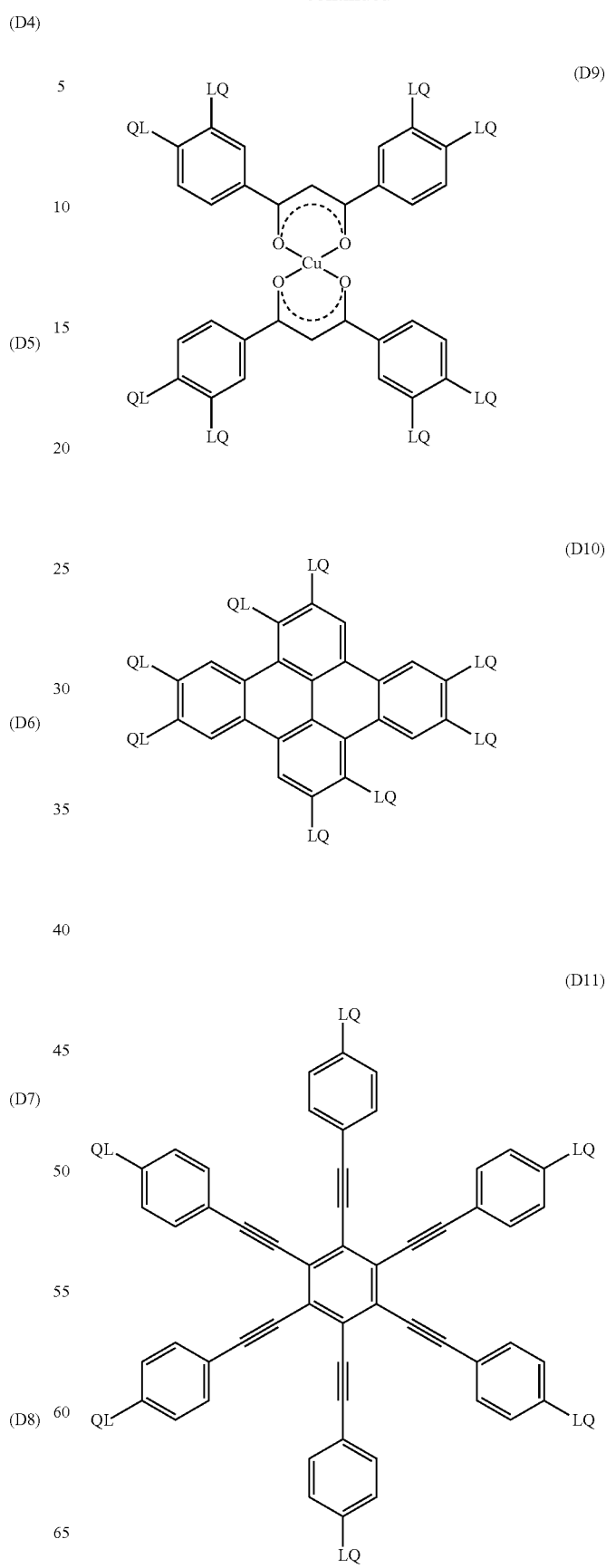
(D9)
(D10)
(D11)

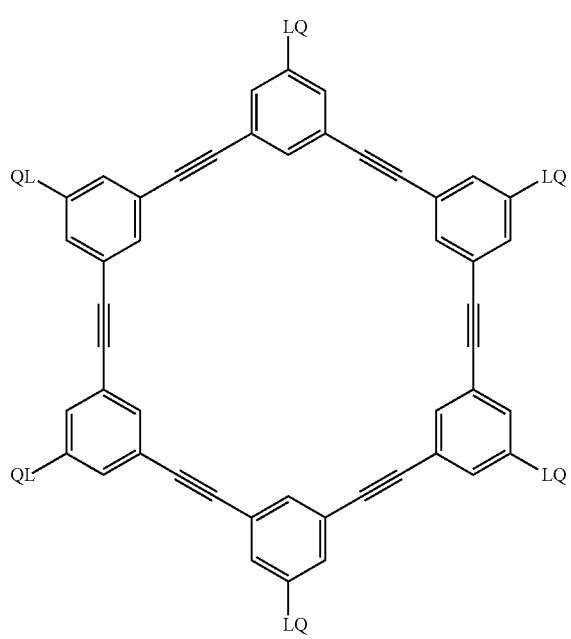
(D12)

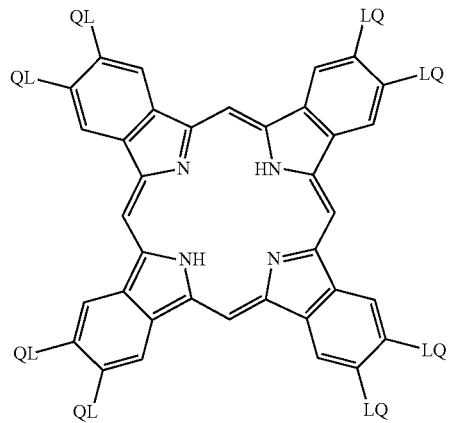
(D13)

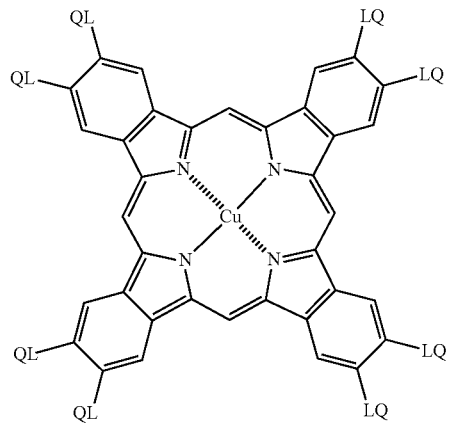
(D14)

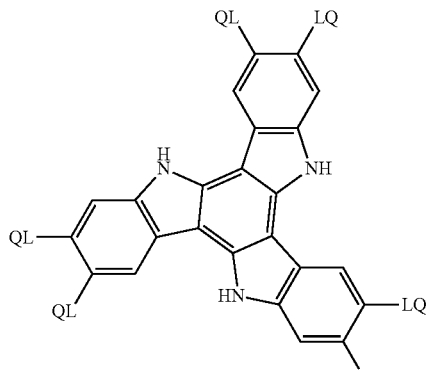
(D15)

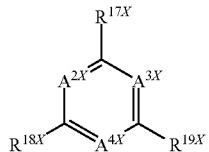
(D16)

in D1 to D16, L represents a divalent linking group;
Q represents a hydrogen atom, a halogen atom, a cyano group, or a functional group,
$A^{2x}$, $A^{3x}$, and $A^{4x}$ each independently represent —CH= or N=, $R^{17x}$, $R^{18x}$, and $R^{19x}$ each independently represent *—$X^{211x}$—$(Z^{21x}$—$X^{212x})_{n21x}$-$L^{21x}$-Q, * represents a position bonded to a central ring, $X^{211X}$ and $X^{212X}$ each independently represent a single bond, —O—, —C(=O)—, —OC(=O)—, —OC(=O)O—, —OC(=O)NH—, —OC(=O)S—, —C(=O)O—, —C(=O)NH—, —C(=O)S—, —NHC(=O)—, —NHC(=O)O—, —NHC(=O)NH—, —NHC(=O)S—, —S—, —SC(=O)—, —SC(=O)O—, —SC(=O)NH—, or —SC(=O)S—, $Z^{21X}$ each independently represents an aromatic group as a 5-membered or 6-membered ring or a non-aromatic group as a 5-membered or 6-membered ring, $L^{21X}$ represents a divalent linking group or a single bond linking $X^{212X}$ and Q to each other, $n^{21X}$ represents an integer of 1 to 3, and in a case where $n^{21X}$ is equal to or greater than 2, a plurality of groups represented by $Z^{21X}$—$X^{212X}$ may be the same as or different from each other.

2. The thermally conductive material according to claim 1, comprising:
a cured substance of a resin composition containing one or more compounds selected from the group consisting of compounds represented by any of General Formulae D1 to D16,
wherein the disk-like compound has one or more functional groups.

3. The thermally conductive material according to claim 2,
wherein the cured substance of a resin composition containing the disk-like compound having two or more functional groups,
the functional groups are selected from the group consisting of a (meth)acryl group, a (meth)acrylamide group, an oxiranyl group, an oxetanyl group, a hydroxyl group, an amino group, a thiol group, an isocyanate group, a carboxyl group, and a carboxylic acid anhydride group.

4. The thermally conductive material according to claim 3, wherein the disk-like compound has 3 to 8 functional groups described above.

5. The thermally conductive material according to claim 3, wherein the disk-like compound is a compound represented by General Formula (XI),

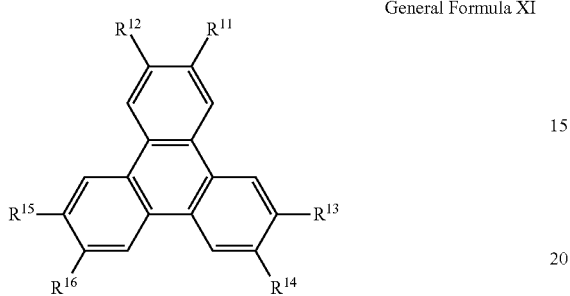

General Formula XI in the formula, $R^{11}$, $R^{12}$, $R^{13}$, $R^{14}$, $R^{15}$, and $R^{16}$ each independently represent *—$X^{11}$-$L^{11}$-$P^{11}$ or *—$X^{12}$—$Y^{12}$, * represents a position bonded to a triphenylene ring, two or more among $R^{11}$, $R^{12}$, $R^{13}$, $R^{14}$, $R^{15}$, and $R^{16}$ represent *—$X^{11}$-$L^{11}$-$P^{11}$, $X^{11}$ and $X^{12}$ each independently represent a single bond, —O—, —C(=O)—, —OC(=O)—, —OC(=O)O—, —OC(=O)NH—, —OC(=O)S—, —C(=O)O—, —C(=O)NH—, —C(=O)S—, —NHC(=O)—, —NHC(=O)O—, —NHC(=O)NH—, —NHC(=O)S—, —S—, —SC(=O)—, —SC(=O)O—, —SC(=O)NH—, or —SC(=O)S—, $L^{11}$ represents a divalent linking group or a single bond, $P^{11}$ represents a functional group selected from the group consisting of a (meth)acryl group, a (meth)acrylamide group, an oxiranyl group, an oxetanyl group, a hydroxyl group, an amino group, a thiol group, an isocyanate group, a carboxyl group, and a carboxylic acid anhydride group, and $Y^{12}$ represents a hydrogen atom, a linear, branched, or cyclic alkyl group having 1 to 20 carbon atoms, or a group obtained in a case where one methylene group or two or more methylene groups in a linear, branched, or cyclic alkyl group having 1 to 20 carbon atoms are substituted with —O—, —S—, —NH—, —N(CH$_3$)—, —C(=O)—, —OC(=O)—, or —C(=O)O—.

6. The thermally conductive material according to claim 5, wherein $R^{11}$, $R^{12}$, $R^{13}$, $R^{14}$, $R^{15}$, and $R^{16}$ are the same as each other.

7. The thermally conductive material according to claim 3, wherein the disk-like compound is a compound represented by General Formula (XII),

General Formula (XII)

in the formula, $A^2$, $A^3$, and $A^4$ each independently represent —CH= or N=, $R^{17}$, $R^{18}$, and $R^{19}$ each independently represent *—$X^{211}$—($Z^{21}$—$X^{212}$)$_{n21}$-$L^{21}$-$P^{21}$ or *—$X^{211}$—($Z^{22}$—$X^{222}$)$_{n22}$—$Y^{22}$, * represents a position bonded to a central ring, two or more among $R^{17}$, $R^{18}$, and $R^{19}$ represent *—$X^{211}$—($Z^{21}$—$X^{212}$)$_{n21}$-$L^{21}$-$P^{21}$, $X^{211}$ and $X^{212}$ each independently represent a single bond, —O—, —C(=O)—, —OC(=O)—, —OC(=O)O—, —OC(=O)NH—, —OC(=O)S—, —C(=O)O—, —C(=O)NH—, —C(=O)S—, —NHC(=O)—, —NHC(=O)O—, —NHC(=O)NH—, —NHC(=O)S—, —S—, —SC(=O)—, —SC(=O)O—, —SC(=O)NH—, or —SC(=O)S—, $Z^{21}$ and $Z^{22}$ each independently represent an aromatic group as a 5-membered or 6-membered ring or a non-aromatic group as a 5-membered or 6-membered ring, $L^{21}$ represents a divalent linking group or a single bond linking $X^{212}$ and $P^{21}$ each other, $P^{21}$ represents a functional group selected from the group consisting of a (meth)acryl group, a (meth)acrylamide group, an oxiranyl group, an oxetanyl group, a hydroxyl group, an amino group, a thiol group, an isocyanate group, a carboxyl group, and a carboxylic acid anhydride group, $Y^{22}$ represents a hydrogen atom, a linear, branched, or cyclic alkyl group having 1 to 20 carbon atoms, or a group obtained in a case where one methylene group or two or more methylene groups in a linear, branched, or cyclic alkyl group having 1 to 20 carbon atoms are substituted with —O—, —S—, —NH—, —N(CH$_3$)—, —C(=O)—, —OC(=O)—, or —C(=O)O—, $n^{21}$ and $n^{22}$ each independently represent an integer of 0 to 3, and in a case where each of $n^{21}$ and $n^{22}$ is equal to or greater than 2, a plurality of groups represented by $Z^{21}$—$X^{212}$ and $Z^{22}$—$X^{222}$ may be the same as or different from each other.

8. The thermally conductive material according to claim 7, wherein $R^{17}$, $R^{18}$, and $R^{19}$ are the same as each other.

9. The thermally conductive material according to claim 3, wherein the resin composition contains a curing agent having a group selected from the group consisting of an amino group, a thiol group, a hydroxyl group, a carboxyl group, a carboxylic acid anhydride group, and an isocyanate group.

10. The thermally conductive material according to claim 9, wherein the resin composition contains the disk-like compound having an oxiranyl group.

11. The thermally conductive material according to claim 3, wherein a content of an inorganic substance in the resin composition with respect to the mass of solid contents in the resin composition is 30% by mass to 90% by mass.

12. The thermally conductive material according to claim 1, wherein the disk-like compound includes one or more compounds which are selected from the group consisting of compounds represented by any of General Formulae D1 to D16, and in which all Q's represent a hydrogen atom, a halogen atom, or a cyano group.

13. The thermally conductive material according to claim 1, wherein the disk-like compound is a liquid crystal compound.

14. The thermally conductive material according to claim 1, wherein the inorganic substance further comprises aluminum nitride.

15. The thermally conductive material according to claim 1, wherein a surface of the inorganic substance is modified with a boronic acid compound or an aldehyde compound.

16. A sheet comprising a layer formed of the thermally conductive material according to claim 1.

17. The sheet according to claim 16, wherein the sheet s a heat dissipation sheet.

18. A device comprising:
the thermally conductive material according to claim 1.

* * * * *